United States Patent
Tsukamoto

(10) Patent No.: US 11,171,155 B2
(45) Date of Patent: Nov. 9, 2021

(54) MULTI-LAYER SEMICONDUCTOR ELEMENT, SEMICONDUCTOR DEVICE, AND ELECTRONIC DEVICE FOR STORAGE, AND METHOD OF MANUFACTURING THE SAME

(71) Applicant: SONY CORPORATION, Tokyo (JP)

(72) Inventor: Masanori Tsukamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/078,844

(22) PCT Filed: Jan. 24, 2017

(86) PCT No.: PCT/JP2017/002216
§ 371 (c)(1),
(2) Date: Aug. 22, 2018

(87) PCT Pub. No.: WO2017/154385
PCT Pub. Date: Sep. 14, 2017

(65) Prior Publication Data
US 2019/0057971 A1    Feb. 21, 2019

(30) Foreign Application Priority Data
Mar. 7, 2016 (JP) .............................. JP2016-043347

(51) Int. Cl.
*H01L 29/08* (2006.01)
*H01L 27/1159* (2017.01)
(Continued)

(52) U.S. Cl.
CPC ...... *H01L 27/1159* (2013.01); *H01L 21/0228* (2013.01); *H01L 21/02189* (2013.01);
(Continued)

(58) Field of Classification Search
CPC .......... H01L 29/0847; H01L 29/66045; H01L 29/6684; H01L 29/78391
See application file for complete search history.

(56) References Cited

U.S. PATENT DOCUMENTS 6,205,048 B1    3/2001   Lee
6,222,756 B1    4/2001   Lee
(Continued)

FOREIGN PATENT DOCUMENTS

JP    H11-214642    8/1999
JP    2006-054435   2/2006
(Continued)

OTHER PUBLICATIONS

Huang et al., "Comprehensive Performance Re-assessment of TFETs with a Novel Design by Gate and Source Engineering from Device/Circuit Perspective," IEEE, 2014, 4 pages.
(Continued)

*Primary Examiner* — Hoai V Pham
(74) *Attorney, Agent, or Firm* — Sheridan Ross P.C.

(57) ABSTRACT

Provided are a semiconductor storage element, a semiconductor device, an electronic device, and a manufacturing method of a semiconductor storage element that enable higher-speed operations. The semiconductor storage element includes: a first semiconductor layer of a first conductivity type; a second semiconductor layer of a second conductivity type that is provided below the first semiconductor layer; a gate electrode provided on the first semiconductor layer; a gate insulator film provided between the first semiconductor layer and the gate electrode; a drain region of the second conductivity type that is provided in the first semiconductor layer on one side of the gate electrode; a source region of the second conductivity type that is provided in the first semiconductor layer on another side facing the one side across the gate electrode; and a bit line
(Continued)

configured to electrically connect with both of the source region and the first semiconductor layer.

18 Claims, 21 Drawing Sheets

(51) Int. Cl.
    *H01L 21/28*     (2006.01)
    *H01L 29/78*     (2006.01)
    *H01L 21/02*     (2006.01)
    *H01L 21/3213*     (2006.01)
    *H01L 27/11592*     (2017.01)
    *H01L 29/06*     (2006.01)
    *H01L 29/51*     (2006.01)
    *H01L 29/66*     (2006.01)
    *H01L 21/3105*     (2006.01)

(52) U.S. Cl.
    CPC .. *H01L 21/02194* (2013.01); *H01L 21/32135* (2013.01); *H01L 21/32139* (2013.01); *H01L 27/11592* (2013.01); *H01L 29/0649* (2013.01); *H01L 29/0847* (2013.01); *H01L 29/40111* (2019.08); *H01L 29/516* (2013.01); *H01L 29/517* (2013.01); *H01L 29/6659* (2013.01); *H01L 29/6684* (2013.01); *H01L 29/7833* (2013.01); *H01L 29/7843* (2013.01); *H01L 29/78391* (2014.09); *H01L 21/0217* (2013.01); *H01L 21/02164* (2013.01); *H01L 21/02238* (2013.01); *H01L 21/02255* (2013.01); *H01L 21/02271* (2013.01); *H01L 21/02274* (2013.01); *H01L 21/31053* (2013.01); *H01L 29/513* (2013.01)

(56) References Cited

U.S. PATENT DOCUMENTS

| | | | |
|---|---|---|---|
| 6,352,864 | B1 | 3/2002 | Lee |
| 2005/0093030 | A1* | 5/2005 | Doris ............... H01L 21/823807 257/288 |
| 2007/0200157 | A1* | 8/2007 | Shino .................... H01L 27/108 257/296 |
| 2008/0158934 | A1 | 7/2008 | Kang et al. |
| 2009/0261395 | A1 | 10/2009 | Boescke |
| 2010/0110753 | A1* | 5/2010 | Slesazeck .............. G11C 5/063 365/145 |
| 2012/0176829 | A1 | 7/2012 | Kang et al. |
| 2017/0358590 | A1* | 12/2017 | Kang ................ H01L 27/11524 |

FOREIGN PATENT DOCUMENTS

| | | |
|---|---|---|
| JP | 2007-115733 | 5/2007 |
| JP | 2007-266569 | 10/2007 |
| JP | 2008-165970 | 7/2008 |
| JP | 2015-056485 | 3/2015 |
| WO | WO 99/026252 | 5/1999 |
| WO | WO 2010/131311 | 11/2010 |

OTHER PUBLICATIONS

Muller et al., "Ferroelectric Hafnium Oxide: A CMOS-compatible and highly scalable approach to future ferroelectric memories," IEEE, 2013, 4 pages.

International Search Report prepared by the Japan Patent Office dated Apr. 5, 2017, for International Application No. PCT/JP2017/002216.

* cited by examiner

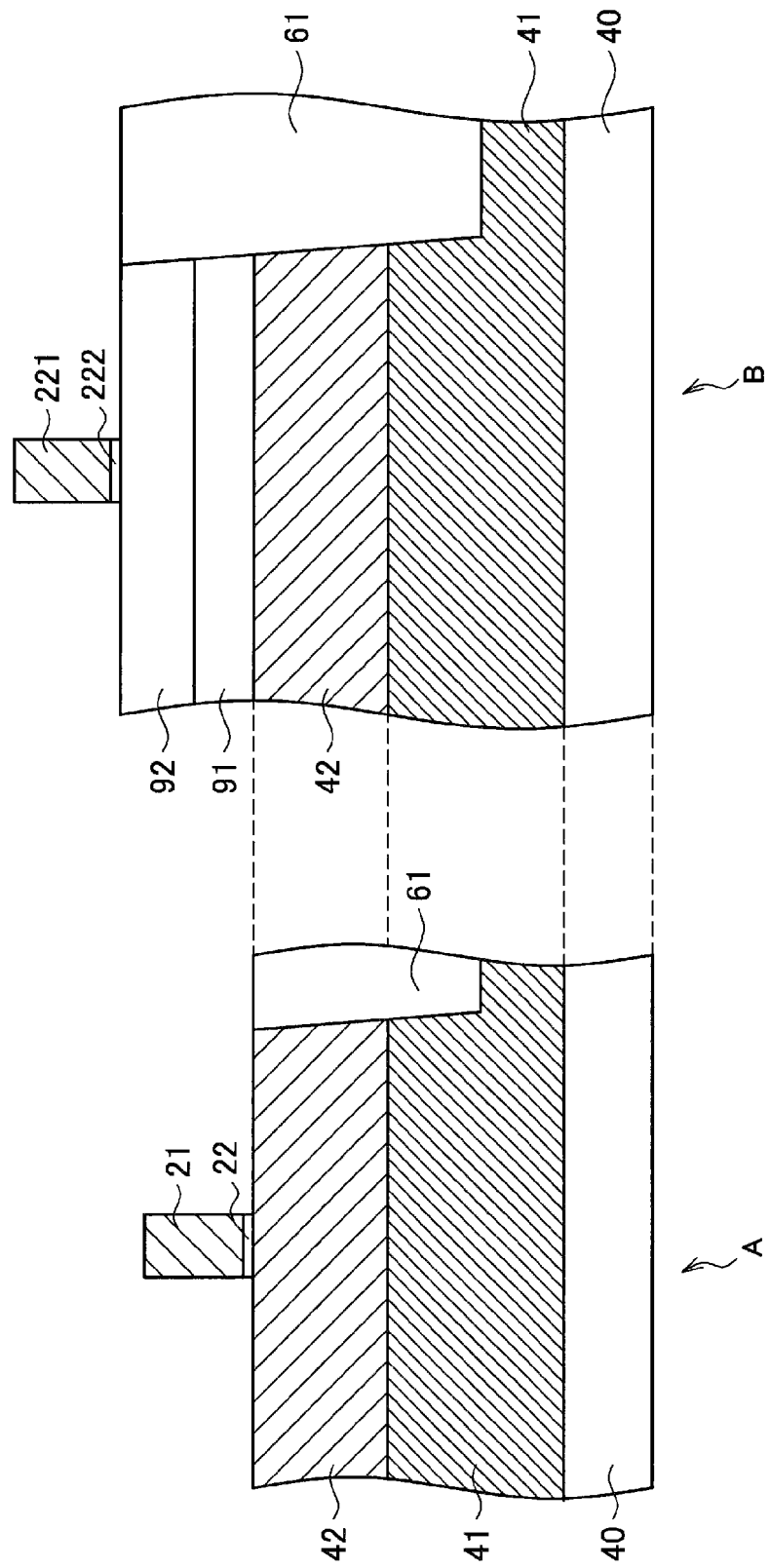

MULTI-LAYER SEMICONDUCTOR ELEMENT, SEMICONDUCTOR DEVICE, AND ELECTRONIC DEVICE FOR STORAGE, AND METHOD OF MANUFACTURING THE SAME

CROSS REFERENCE TO RELATED APPLICATIONS

This application is a national stage application under 35 U.S.C. 371 and claims the benefit of PCT Application No. PCT/JP2017/002216 having an international filing date of 24 Jan. 2017, which designated the United States, which PCT application claimed the benefit of Japanese Patent Application No. 2016-043347 filed 7 Mar. 2016, the entire disclosures of each of which are incorporated herein by reference.

TECHNICAL FIELD

The present disclosure relates to a semiconductor storage element, a semiconductor device, an electronic device, and a manufacturing method of a semiconductor storage element.

BACKGROUND ART

In recent years, a Large Scale Integration (LSI) on which an analog circuit, a memory, an integrated circuit, and the like are mixedly mounted on one chip is commercialized as a System on a Chip (SoC).

As the integrated circuit mounted on the LSI, an n-type Metal-Oxide-Semiconductor Field-Effect Transistor (MOSFET) and a complementary MOS (CMOS) circuit including a p-type MOSFET are mainly used. The CMOS circuit is widely used because the CMOS circuit consumes less power, can perform high-speed operations, and miniaturization and high integration can be easily performed.

In addition, as the memory mounted on the LSI, for example, a Static Random Access Memory (RAM) is used, but in recent years, it is considered to use a Dynamic RAM (DRAM), a Magnetic RAM (MRAM), or a Ferroelectric RAM (FeRAM) for reducing cost and power consumption.

Here, the FeRAM is a memory that utilizes a ferroelectric that can cause polarization even in the absence of an external electric field, and can control a direction of polarization depending on an external electric field, to store information in a direction of residual polarization of the ferroelectric. As a structure of the FeRAM, for example, a one-Transistor-one-Capacitor (1T1C)-type structure that uses a capacitor including a ferroelectric, as a storage element, a one-Transistor (1T)-type structure that uses, as a storage element, a transistor that uses a ferroelectric film in a gate insulator film, and the like are proposed.

For example, in Patent Literature 1 described below, a FeRAM having the 1T-type structure, and a method of writing into the FeRAM are disclosed. In the FeRAM disclosed in Patent Literature 1, by connecting a bit line to a semiconductor substrate from the outside of a storage element, and controlling an electric field generated between the semiconductor substrate and a gate electrode, a direction of residual polarization of a ferroelectric film provided between the gate electrode and the semiconductor substrate is controlled.

CITATION LIST

Patent Literature

Patent Literature 1: WO 1999/026252

DISCLOSURE OF INVENTION

Technical Problem

Nevertheless, in the FeRAM disclosed in Patent Literature 1, because connection with storage elements is established by the contact to a well, and connection is established from the outside of a semiconductor storage element array in which storage elements are arranged in a matrix, applied voltage cannot be controlled at high speed, and it has been difficult to operate the storage elements at high speed. In addition, in the FeRAM disclosed in Patent Literature 1, it has been difficult to control voltage to be applied to the semiconductor substrate, for each of the storage elements.

In view of the foregoing, the present disclosure proposes a semiconductor storage element, a semiconductor device, an electronic device, and a manufacturing method of a semiconductor storage element that are novel and improved, and enable higher-speed operations.

Solution to Problem

According to the present disclosure, there is provided a semiconductor storage element including: a first semiconductor layer of a first conductivity type: a second semiconductor layer of a second conductivity type that is provided below the first semiconductor layer: a gate electrode provided on the first semiconductor layer; a gate insulator film provided between the first semiconductor layer and the gate electrode; a drain region of the second conductivity type that is provided in the first semiconductor layer on one side of the gate electrode; a source region of the second conductivity type that is provided in the first semiconductor layer on another side facing the one side across the gate electrode; and a bit line configured to electrically connect with both of the source region and the first semiconductor layer.

In addition, according to the present disclosure, there is provided a semiconductor device including: a storage device in which semiconductor storage elements are arranged in a matrix. Each of the semiconductor storage elements includes a first semiconductor layer of a first conductivity type, a second semiconductor layer of a second conductivity type that is provided below the first semiconductor layer, a gate electrode provided on the first semiconductor layer, a gate insulator film provided between the first semiconductor layer and the gate electrode, a drain region of the second conductivity type that is provided in the first semiconductor layer on one side of the gate electrode, a source region of the second conductivity type that is provided in the first semiconductor layer on another side facing the one side across the gate electrode, and a bit line configured to electrically connect with both of the source region and the first semiconductor layer.

In addition, according to the present disclosure, there is provided a electronic device including: a storage device in which semiconductor storage elements are arranged in a matrix. Each of the semiconductor storage elements includes a first semiconductor layer of a first conductivity type, a second semiconductor layer of a second conductivity type that is provided below the first semiconductor layer, a gate electrode provided on the first semiconductor layer, a gate insulator film provided between the first semiconductor layer and the gate electrode, a drain region of the second conductivity type that is provided in the first semiconductor layer on one side of the gate electrode, a source region of the second conductivity type that is provided in the first semiconductor layer on another side facing the one side across the gate electrode, and a bit line configured to electrically connect with both of the source region and the first semiconductor layer.

In addition, according to the present disclosure, there is provided a manufacturing method of a semiconductor storage element, the manufacturing method including: a process of forming a first semiconductor layer of a first conductivity type, and a second semiconductor layer of a second conductivity type that is to be provided below the first semiconductor layer; a process of forming a gate insulator film on the first semiconductor layer; a process of forming a gate electrode on the gate insulator film: a process of forming a drain region of the second conductivity type, in the first semiconductor layer on one side of the gate electrode, and forming a source region of the second conductivity type, in the first semiconductor layer on another side facing the one side across the gate electrode; and a process of forming a bit line configured to electrically connect with both of the source region and the first semiconductor layer.

According to the present disclosure, because electric connection from the bit line to the first semiconductor layer that applies an electric field to a ferroelectric film can be provided inside each of the semiconductor storage elements, an electric field to be applied to the ferroelectric film can be controlled at higher speed.

Advantageous Effects of Invention

As described above, according to the present disclosure, a semiconductor storage element that can operate at higher speed can be provided.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 21 is a cross-sectional view describing each manufacturing process of the semiconductor device according to this embodiment.

MODE(S) FOR CARRYING OUT THE INVENTION

Figure 1:
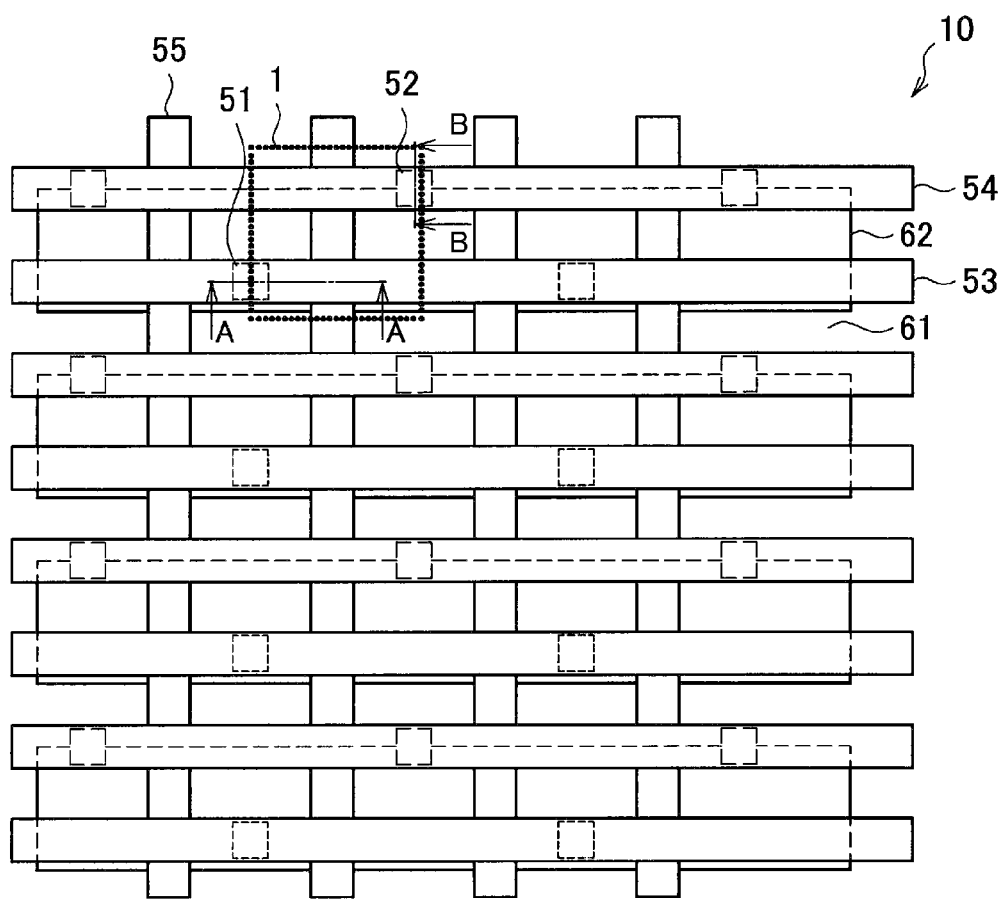
FIG. 1 is a plan view illustrating a planar structure of a semiconductor storage element according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, the description will be given in the following order.

1. First Embodiment
1.1. Planar Structure of Semiconductor Storage Element
1.2. Layer Stack Structure of Semiconductor Storage Element
1.3. Manufacturing Method of Semiconductor Storage Element
1.4. Modified Example
2. Second Embodiment
2.1. Planar Structure of Semiconductor Device
2.2. Layer Stack Structure of Semiconductor Device
2.3. Manufacturing Method of Semiconductor Device
3. Conclusion

1. FIRST EMBODIMENT

[1.1. Planar Structure of Semiconductor Storage Element]

First of all, a planar structure of a semiconductor storage element according to a first embodiment of the present disclosure will be described with reference to FIG. 1. FIG. 1 is a plan view illustrating a planar structure of a semiconductor storage element 1 according to the present embodiment.

The semiconductor storage element 1 is a Ferroelectric Random Access Memory (FeRAM) including a field effect transistor (FET) that uses a ferroelectric in a gate insulator film. The semiconductor storage element 1 can write information thereinto by applying an electric field to the gate insulator film and controlling a direction of residual polarization of the ferroelectric. In addition, the semiconductor storage element 1 can read out stored information by utilizing a change in resistance of a channel of the field effect transistor that is caused depending on the direction of residual polarization of the ferroelectric used in the gate insulator film.

The foregoing semiconductor storage element 1 can function as a storage device 10 that stores information, by arranging a number of semiconductor storage elements having a similar structure, in a matrix.

As illustrated in FIG. 1, the semiconductor storage element 1 is provided in an activation region 62 doped with an impure substance, and is connected with a word line 55, a bit line 54, and a data line 53. In addition, element separation layers 61 having insulation properties are provided between the activation regions 62 in a direction in which the word line 55 extends. By electrically separating the activation regions 62 from each other, the element separation layers 61 electrically separate the semiconductor storage elements 1 from each other in the direction in which the word line 55 extends.

The word line 55 extends in one direction, and operates as a gate electrode of the field effect transistor constituting the semiconductor storage element 1.

The data line 53 extends in a direction perpendicular to the word line 55, and electrically connects with a drain region of the field effect transistor at a contact plug 51. The data line 53 thereby operates as a drain electrode of the field effect transistor constituting the semiconductor storage element 1.

The bit line 54 extends in the direction perpendicular to the word line 55, and electrically connects with a source region of the field effect transistor at a contact plug 52. The bit line 54 thereby operates as a source electrode of the field effect transistor constituting the semiconductor storage element 1. In addition, at the contact plug 52, the bit line 54 electrically connects with a semiconductor substrate on which the field effect transistor is provided. The bit line 54 can thereby generate an electric field between the word line 55, and control polarization of the gate insulator film formed by the ferroelectric.

In other words, in the case of writing information, the semiconductor storage element 1 can write information thereinto by changing a direction of residual polarization by providing an electric potential difference for reversing a polarization direction of the gate insulator film, between the word line 55 and the bit line 54 connecting to the target semiconductor storage element 1.

In addition, in the case of reading out information, the semiconductor storage element 1 first applies, to the word line 55 connecting to the target semiconductor storage element 1, voltage that is equal to or larger than a threshold value for operating the field effect transistor, and does not reverse the polarization direction of the gate insulator film, and causes a channel to be formed. Because the formed channel varies in resistance depending on the direction of residual polarization of the gate insulator film, the semiconductor storage element 1 can read out information stored in the target semiconductor storage element 1, by measuring current flowing from the data line 53 to the bit line 54.

[1.2. Layer Stack Structure of Semiconductor Storage Element]

Figure 2:
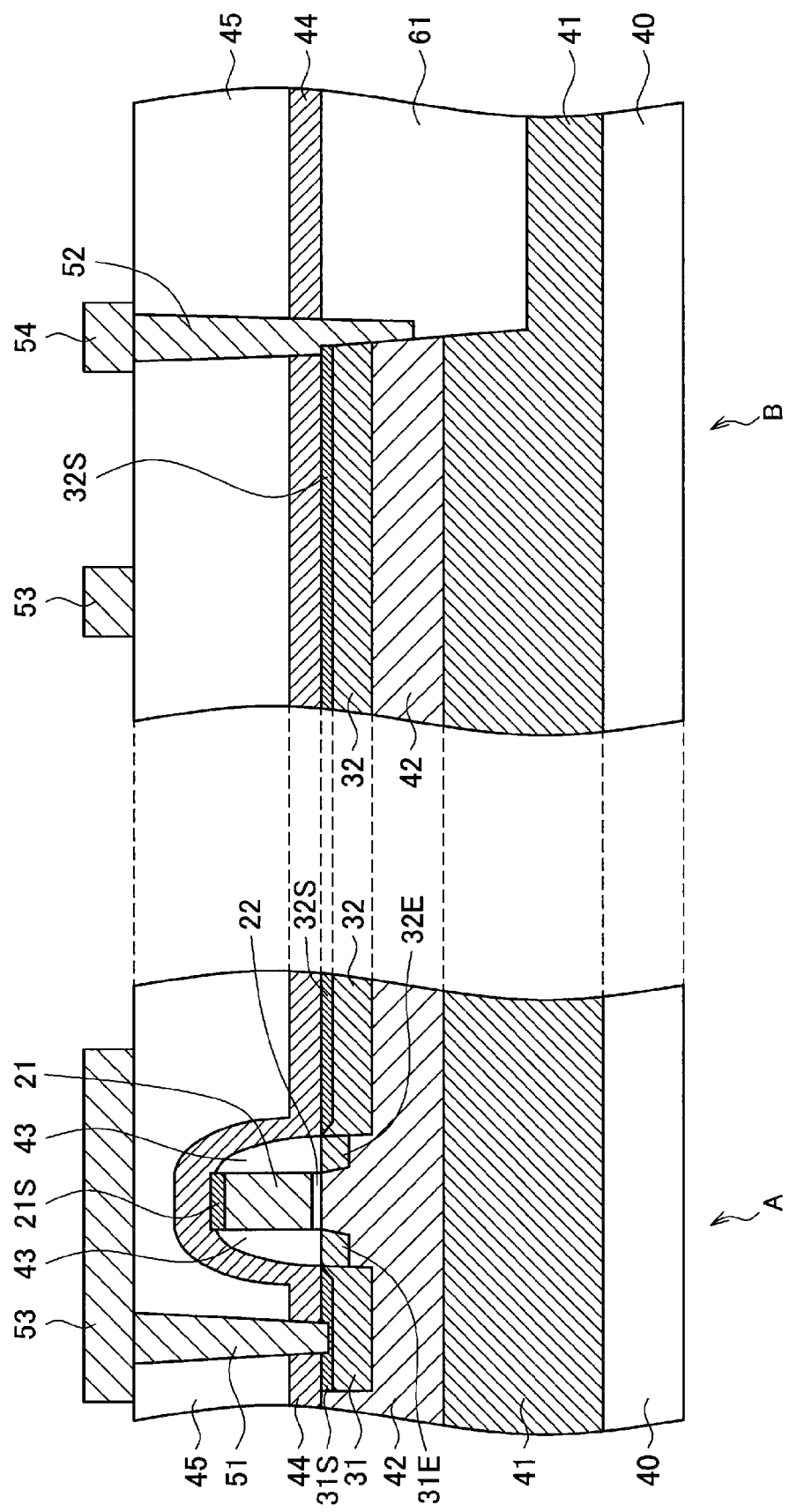
FIG. 2 is a cross-sectional view illustrating a layer stack structure of the semiconductor storage element according to this embodiment.

Subsequently, a layer stack structure of the semiconductor storage element 1 according to the present embodiment will be described with reference to FIG. 2. FIG. 2 is a cross-sectional view illustrating a layer stack structure of the semiconductor storage element 1 according to the present embodiment. Note that, a cross-section indicated by "A" in FIG. 2 illustrates a cross-section cut along an AA line in FIG. 1, and a cross-section indicated by "B" in FIG. 2 illustrates a cross-section cut along a BB line in FIG. 1.

As illustrated in FIG. 2, the semiconductor storage element 1 includes a semiconductor substrate 40, a first semiconductor layer 42 and a second semiconductor layer 41 that are provided on the semiconductor substrate 40, a gate electrode 21 provided on the first semiconductor layer 42 via a gate insulator film 22, side wall insulating films 43 provided on the both side surfaces of the gate electrode 21, and a liner layer 44 and a planarization film 45 that are provided on the first semiconductor layer 42 and the gate electrode 21. In addition, the semiconductor storage element 1 is electrically separated from other elements by the element separation layer 61.

In the first semiconductor layer 42, a source region 32, a drain region 31, and extension regions 32E and 31E are provided. The source region 32 electrically connects with the bit line 54 via a contact region 32S and the contact plug 52, and the drain region 31 electrically connects with the data line 53 via a contact region 31S and the contact plug 51. In addition, the gate electrode 21 electrically connects with the word line 55 not illustrated in FIG. 2, via a contact region 21S.

Note that, in the present specification, a "first conductivity type" represents either one of a "p-type" and an "n-type", and a "second conductivity type" represents the other one of the "p-type" and "n-type" that is different from the "first conductivity type".

The semiconductor substrate 40 is a support substrate on which the semiconductor storage element 1 is to be formed. As the semiconductor substrate 40, a substrate including various semiconductors may be used, and for example, a substrate including polycrystalline, monocrystalline, or amorphous silicon (Si) may be used. In addition, the semiconductor substrate 40 may be a Silicon On Insulator (SOI) substrate in which an insulating film such as $SiO_2$ is sandwiched in a silicon substrate.

The first semiconductor layer 42 is a layer of the first conductivity type, and is provided on the semiconductor substrate 40 on a side on which the field effect transistor constituting the semiconductor storage element 1 is to be formed. Specifically, the first semiconductor layer 42 is formed by introducing an impure substance of the first conductivity type (e.g. p-type impure substance such as boron (B)) onto the front surface side of the semiconductor substrate 40. In addition, a region in which the first semiconductor layer 42 is formed serves as the activation region 62.

During writing into the semiconductor storage element 1, the first semiconductor layer 42 applies an electric field to the gate insulator film 22 between the gate electrode 21, and controls a polarization direction of the gate insulator film 22. In addition, during readout from the semiconductor storage element 1, the first semiconductor layer 42 functions as a channel region of the field effect transistor, and forms a flow path of current from the drain region 31 to the source region 32.

The second semiconductor layer 41 is a layer of the second conductivity type, and is provided on the semiconductor substrate 40 below the first semiconductor layer 42. Specifically, the second semiconductor layer 41 is formed by introducing an impure substance of the second conductivity type (e.g. n-type impure substance such as phosphorus (P) and arsenic (As)) onto the semiconductor substrate 40 below the first semiconductor layer 42.

Note that, the second semiconductor layer 41 is provided also below the element separation layer 61. The second semiconductor layer 41 can thereby prevent voltage or the like that is applied to the first semiconductor layer 42, from interfering with an adjacent semiconductor storage element via the semiconductor substrate 40, in the direction in which the word line 55 extends. Thus, the second semiconductor layers 41 can electrically separate the semiconductor storage elements 1 from each other in the direction in which the word line 55 extends.

At least part of the gate insulator film 22 is formed by ferroelectric material. For example, the gate insulator film 22 may be formed by ferroelectric material having a perovskite structure such as lead zirconium titanate (Pb(Zr, Ti)O$_3$: PZT), or strontium bismuth tantalate (SrBi$_2$Ta$_2$O$_9$: SBT). In addition, the gate insulator film 22 may be a ferroelectric film obtained by transubstantiating, by thermal treatment or the like, a film formed by high-dielectric material such as HfO$_x$, ZrO$_x$, or HfZrO$_x$, or may be a ferroelectric film formed by doping a film formed by these high-dielectric materials, with an atom such as lanthanum (La), silicon (Si), or gadolinium (Gd). Because the gate insulator film 22 formed by ferroelectric material varies in polarization direction by an external electric field being applied, and polarization remains even if the external electric field becomes non-existent, information can be stored depending on the direction of residual polarization.

In addition, the gate insulator film 22 may be formed by a plurality of layers. For example, the gate insulator film 22 may be a film stack including a film including ferroelectric material, and an insulating film such as silicon oxide (SiO$_x$) or silicon nitride (SiN$_x$).

The gate electrode 21 is provided on the gate insulator film 22, and is electrically connected with the word line 55 not illustrated in FIG. 2. Specifically, the gate electrode 21 may be formed by polysilicon or the like, or may be formed by metal having a smaller resistance value than that of polysilicon. In addition, the gate electrode 21 may be formed into a layer stack structure including a plurality of layers including a metal layer, and a layer including polysilicon. For example, the gate electrode 21 may be formed into a layer stack structure including a metal layer including TiN or TaN that is provided on the gate insulator film 22, and a layer including polysilicon. According to such a layer stack structure, the gate electrode 21 can prevent a depletion layer from being formed in the layer of the gate electrode 21 that includes polysilicon, by applied voltage.

During writing into the semiconductor storage element 1, the gate electrode 21 applies an electric field to the gate insulator film 22, between the first semiconductor layer 42, and controls a polarization direction of the gate insulator film 22. In addition, during readout from the semiconductor storage element 1, the gate electrode 21 forms a channel in the first semiconductor layer 42 by applying voltage to the gate insulator film 22 to such a degree that the polarization direction is not reversed, and forms a flow path of current from the drain region 31 to the source region 32.

The contact region 21S is provided on the front surface of the gate electrode 21, and reduces contact resistance between the gate electrode 21 and the word line 55 not illustrated in FIG. 2. Specifically, the contact region 21S may be formed by an alloy of high melting point metal such as Ni, and metal or polysilicon that forms the gate electrode 21. For example, the contact region 21S may be formed by a high melting point metal silicide such as NiSi.

The drain region 31 and the source region 32 are regions of the second conductivity type, and are provided in the first semiconductor layer 42 on the both sides across the gate electrode 21. Specifically, the drain region 31 and the source region 32 are formed by introducing an impure substance of the second conductivity type (e.g. n-type impure substance such as phosphorus (P) and arsenic (As)) to the first semiconductor layer 42 on the both sides of the gate electrode 21.

The extension regions 31E and 32E are regions of the second conductivity type that have lower concentration than the drain region 31 and the source region 32, and are provided in the first semiconductor layer 42 between the drain region 31 and the source region 32, and the gate electrode 21, adjacently to the drain region 31 and the source region 32, respectively. When the semiconductor storage element 1 functions as a field effect transistor (i.e. during readout from the semiconductor storage element 1), the extension regions 31E and 32E mitigate an electric field from the drain region 31 and the source region 32 to the channel. The occurrence of hot carrier can be therefore suppressed. Note that, the structure of the field effect transistor including the extension regions 31E and 32E is also referred to as a Lightly Doped Drain (LDD) structure.

The contact region 31S is provided on the front surface of the drain region 31, and reduces contact resistance between the drain region 31 and the contact plug 51. In addition, the contact region 32S is provided on the front surface of the source region 32, and reduces contact resistance between the source region 32 and the contact plug 52. Specifically, the contact regions 31S and 32S may be formed by an alloy of high melting point metal such as Ni, and a semiconductor constituting the first semiconductor layer 42. For example, the contact regions 31S and 32S may be formed by high melting point metal silicide such as NiSi.

The side wall insulating films 43 are side walls with insulating films that are provided on the side surfaces of the gate electrode 21. Specifically, the side wall insulating films 43 are formed by forming insulating films in a region including the gate electrode 21, and then performing etching having perpendicular anisotropy. For example, each of the side wall insulating films 43 may be formed by a single layer or a plurality of layers that includes an insulating oxynitride such as silicon oxide (SiO$_x$) or silicon nitride (SiN$_x$).

The side wall insulating films 43 block an impure substance entering the first semiconductor layer 42 during doping. The side wall insulating films 43 can thereby control a distance between a region to be doped with an impure substance, and the gate electrode 21, highly accurately. In other words, by doping a region with an impure substance of a second conductive property at low concentration before the side wall insulating films 43 are formed, and doping a region with the impure substance of the second conductive property at high concentration after the side wall insulating films 43 are formed, the drain region 31, the source region 32, and the extension regions 31E and 32E can be formed in a desired positional relationship in a self-aligning manner.

Especially in a case where the side wall insulating films 43 have a layer stack structure including a plurality of layers, by performing impure substance doping before and after the formation of each layer of the side wall insulating films 43, positions at which the drain region 31, the source region 32, and the extension regions 31E and 32E are to be formed can be controlled more finely.

The liner layer 44 is an insulating layer provided on the first semiconductor layer 42 over the entire surface while covering the gate electrode 21, and protects the field effect transistor constituting the semiconductor storage element 1. Specifically, the liner layer 44 may be formed by an insulating oxynitride such as silicon oxide ($SiO_x$) or silicon nitride ($SiN_x$).

In addition, the liner layer 44 may be formed as a layer that adds compressional stress or tensile stress to the gate insulator film 22. In such a case, the liner layer 44 can enhance a polarization property of the ferroelectric constituting the gate insulator film 22, by a piezoelectric effect. Note that, for enhancing a polarization property of the ferroelectric constituting the gate insulator film 22, magnitude of compressional stress or tensile stress that is to be added by the liner layer 44 is preferably 1 GPa or more.

The planarization film 45 is provided on the liner layer 44, and performs planarization by burying the field effect transistor constituting the semiconductor storage element 1. The planarization film 45 may be formed by an insulating oxynitride such as silicon oxide ($SiO_x$) or silicon nitride ($SiN_x$). In addition, the planarization film 45 may be formed by insulating organic resin such as epoxy resin or polyimid resin.

The contact plug 51 is provided with penetrating through the liner layer 44 and the planarization film 45, and electrically connects the data line 53 and the drain region 31 by coming into contact with the contact region 31S. Specifically, the contact plug 51 may be formed by low-resistance metal such as titanium (Ti) or tungsten (W), or a metal compound such as titanium nitride (TIN). In addition, the contact plug 51 may be formed into a layer stack structure including a plurality of layers. For example, the contact plug 51 may be formed into a layer stack structure including Ti or TIN, and W.

The element separation layer 61 is provided between the activation regions 62 in which the semiconductor storage elements 1 are provided, and is provided up to a region deeper than the first semiconductor layer 42. The element separation layers 61 can thereby electrically separate the semiconductor storage elements 1 from each other in the direction in which the word line 55 extends. Specifically, the element separation layer 61 may be formed by an insulating oxynitride such as silicon oxide ($SiO_x$) or silicon nitride ($SiN_x$). For example, the element separation layer 61 may be formed by removing a part of the semiconductor substrate 40 in a desired region, by etching or the like, using a Shallow Trench Isolation (STI) method, and then, filling an opening formed by the etching, with silicon oxide ($SiO_x$). In addition, the element separation layer 61 may be formed by thermally oxidizing the semiconductor substrate 40 in a predetermined region, and performing conversion into an oxide, using a Local Oxidation of Silicon (LOCOS) method.

The contact plug 52 is provided near the boundary between the first semiconductor layer 42 and the element separation layer 61, with penetrating through the liner layer 44 and the planarization film 45, and comes into contact with the side surfaces of the contact region 32S and the first semiconductor layer 42. The contact plug 52 thereby electrically connects the bit line 54, and the source region 32 and the first semiconductor layer 42. Note that, the contact plug 52 is provided into a depth not reaching the second semiconductor layer 41. In a case where the contact plug 52 comes into contact with the second semiconductor layer 41, voltage applied to the contact plug 52 can possibly interfere with an adjacent semiconductor storage element via the second semiconductor layer 41. Thus, a depth in which the contact plug 52 is to be formed is preferably set to a depth up to a depth in which the first semiconductor layer 42 is provided.

For example, the contact plug 52 may be formed by low-resistance metal such as titanium (Ti) or tungsten (W), or a metal compound such as titanium nitride (TiN). In addition, the contact plug 52 may be formed into a layer stack structure including a plurality of layers, and may be formed into a layer stack structure including Ti or TiN, and W, for example.

In the semiconductor storage element 1 according to the present embodiment, the contact plug 52 is provided so as to connect with the contact region 32S and the first semiconductor layer 42. The semiconductor storage element 1 can thereby control an electric potential of the first semiconductor layer 42, at the contact plug 52 provided inside each element. Thus, higher-speed operations are enabled. In addition, because the semiconductor storage element 1 can control an electric potential of the first semiconductor layer 42, at the contact plug 52 provided for each element, each element can perform an independent operation without interference.

In addition, by being provided at the boundary between the first semiconductor layer 42 and the element separation layer 61, the contact plug 52 can connect the contact region 32S and the first semiconductor layer 42 more easily. This is because, in the case of forming, by etching, an opening in which the contact plug 52 is to be provided, the element separation layer 61 can be preferentially etched by utilizing a difference in etching rate between the element separation layer 61 and the first semiconductor layer 42. This can cause the side surfaces of the contact region 32S and the first semiconductor layer 42 to be exposed to the opening in which the contact plug 52 is to be provided. Thus, the contact plug 52 can easily come into contact with the contact region 32S and the first semiconductor layer 42.

Note that, in the semiconductor storage element 1 according to the present embodiment, the source region 32 and the first semiconductor layer 42 are short-circuited by the contact plug 52, but this does not particularly matter. This is because, during writing into the semiconductor storage element 1, the semiconductor storage element 1 does not function as a field effect transistor, but functions as a capacitor including the first semiconductor layer 42, the gate insulator film 22, and the gate electrode 21.

In addition, in a case where a field effect transistor is an n-type MOSFET, during readout from the semiconductor storage element 1, 0 V is applied to the contact plug 52 being a source electrode. This is because the contact plug 52 accordingly becomes reverse direction bias to the second semiconductor layer 41 and the drain region 31, and hence leak current does not occur, and an electric field is not applied to the gate insulator film 22 to such a degree that polarization is affected.

[1.3. Manufacturing Method of Semiconductor Storage Element]

Next, a manufacturing method of the semiconductor storage element 1 according to the present embodiment will be described with reference to FIGS. 3 to 10. FIGS. 3 to 10 are cross-sectional views describing manufacturing processes of the semiconductor storage element 1 according to the present embodiment.

Figure 3:
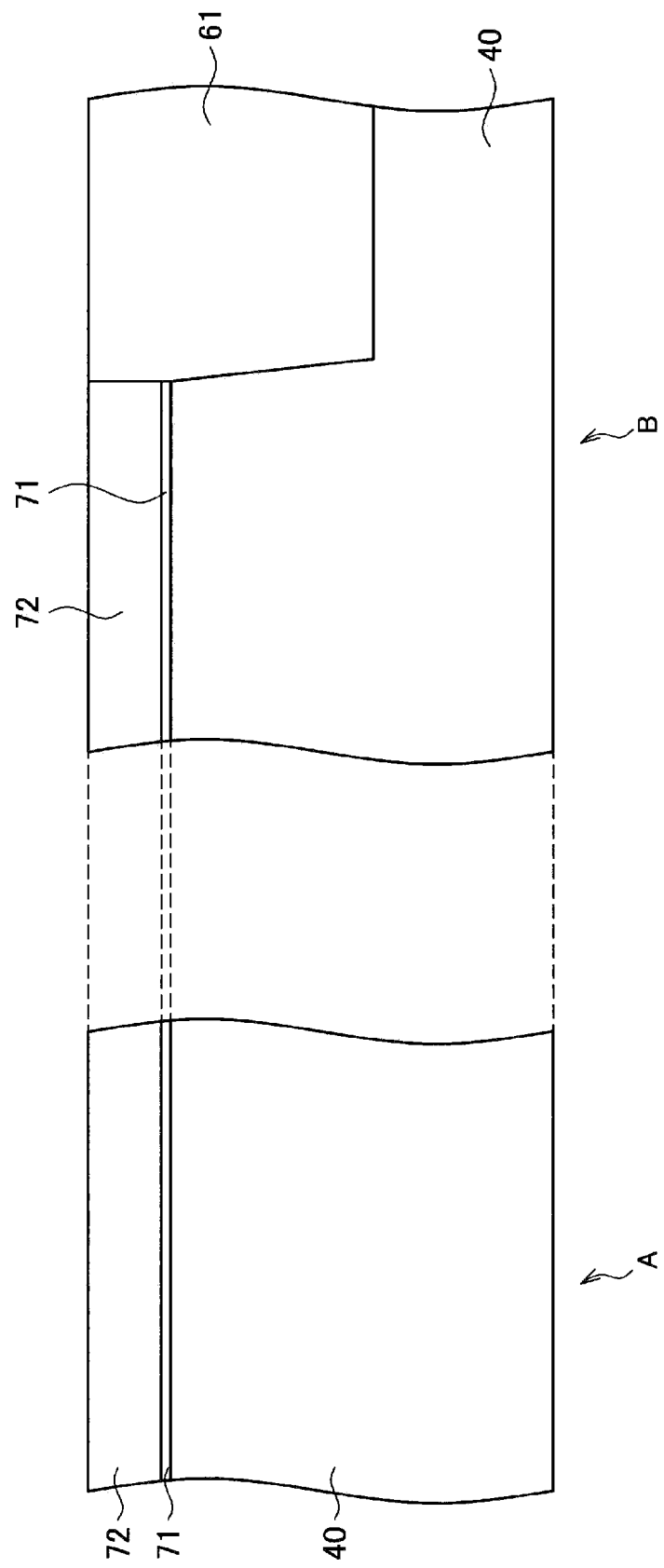
FIG. 3 is a cross-sectional view describing each manufacturing process of the semiconductor storage element according to this embodiment.

First of all, as illustrated in FIG. 3, after insulating layers 71 and 72 are formed on the semiconductor substrate 40, the element separation layer 61 is formed.

Specifically, after the insulating layers 71 and 72 having different compositions are formed on the semiconductor substrate 40 including Si, the activation region 62 (a region in which the first semiconductor layer 42 is to be formed in a subsequent process) is protected by a patterned resist, and the insulating layers 71 and 72 and the semiconductor substrate 40 are etched in a depth of 350 nm to 400 nm.

Note that, the insulating layer 71 is a $SiO_2$ film formed by performing dry oxidation of the semiconductor substrate 40 including Si, for example, and the insulating layer 72 is a $Si_3N_4$ film formed by a low-pressure Chemical Vapor Deposition (CVD) method.

After that, by forming $SiO_2$ into a film having a film thickness of 650 nm to 700 nm, an opening formed by etching is filled, and the element separation layer 61 is formed. For example, a high-density plasma CVD method can be used for the film formation of $SiO_2$. According to this method, a $SiO_2$ film that has better unevenness coatability, and is precise can be formed as the element separation layer 61.

Subsequently, the surface of the semiconductor substrate 40 is planarized by polishing the insulating layer 72 and the element separation layer 61 using a Chemical Mechanical Polish (CMP) method. Note that, the polishing by the CMP is preferably performed to such a degree that the element separation layer 61 formed on the insulating layer 72 can be removed. In addition, unevenness in the entire semiconductor substrate 40 may be reduced by selectively etching protruding regions using a resist or the like that is patterned by a lithography or the like, precedential to the polishing by the CMP.

Figure 4:
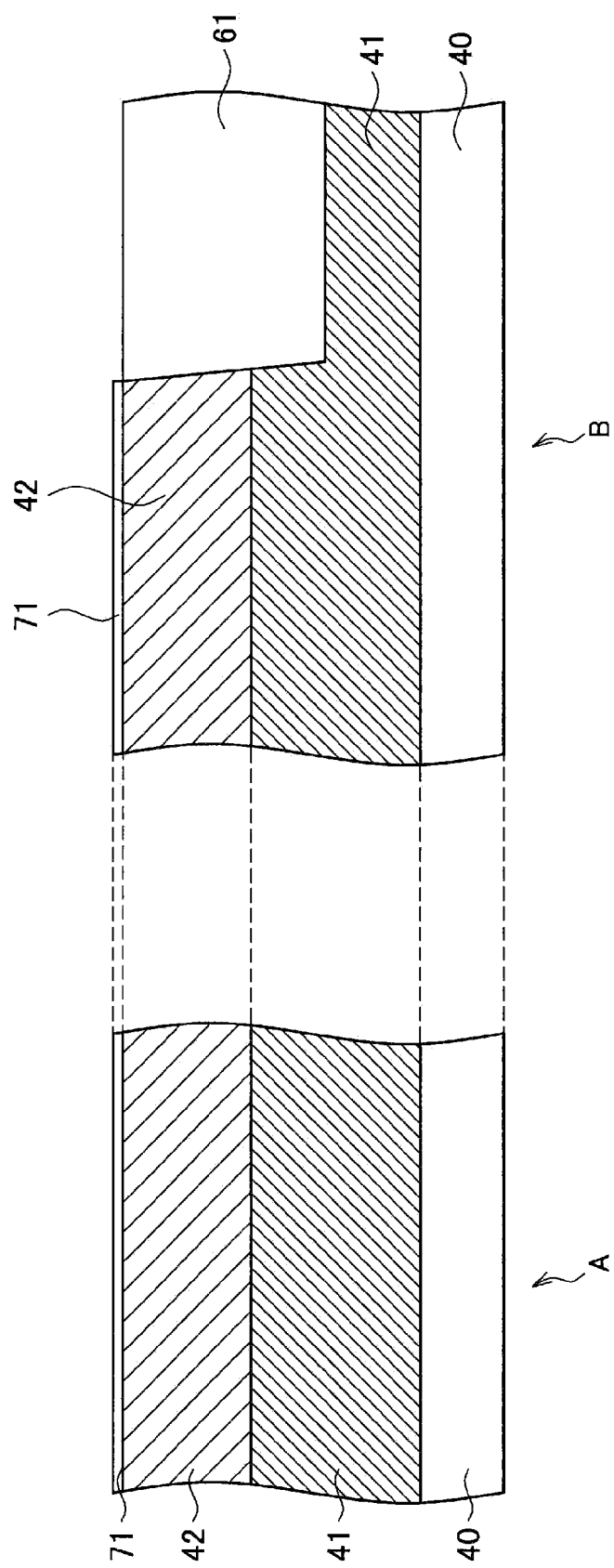
FIG. 4 is a cross-sectional view describing each manufacturing process of the semiconductor storage element according to this embodiment.

Next, as illustrated in FIG. 4, after the insulating layer 72 is removed, impure substance doping is performed, and the first semiconductor layer 42 and the second semiconductor layer 41 are formed.

Specifically, first of all, the insulating layer 72 is removed using hot phosphoric acid or the like. Note that, before the removal of the insulating layer 72, the semiconductor substrate 40 may be annealed under an $N_2$, $O_2$, or $H_2/O_2$ environment. This can make the element separation layer 61 into a more precise film. In addition, corners of the activation region 62 can be rounded.

Subsequently, the first semiconductor layer 42 is formed by ion-implanting an impure substance of the first conductivity type (e.g. boron, etc.) to a region corresponding to the activation region 62, after causing a growth of the insulating layer 71 being a $SiO_2$ film, by further oxidizing the semiconductor substrate 40 including Si, by about 10 nm. Subsequently, the second semiconductor layer 41 is formed by ion-implanting an impure substance of the second conductivity type (e.g. phosphorus, arsenic, etc.) to a region corresponding to the activation region 62.

Figure 5:
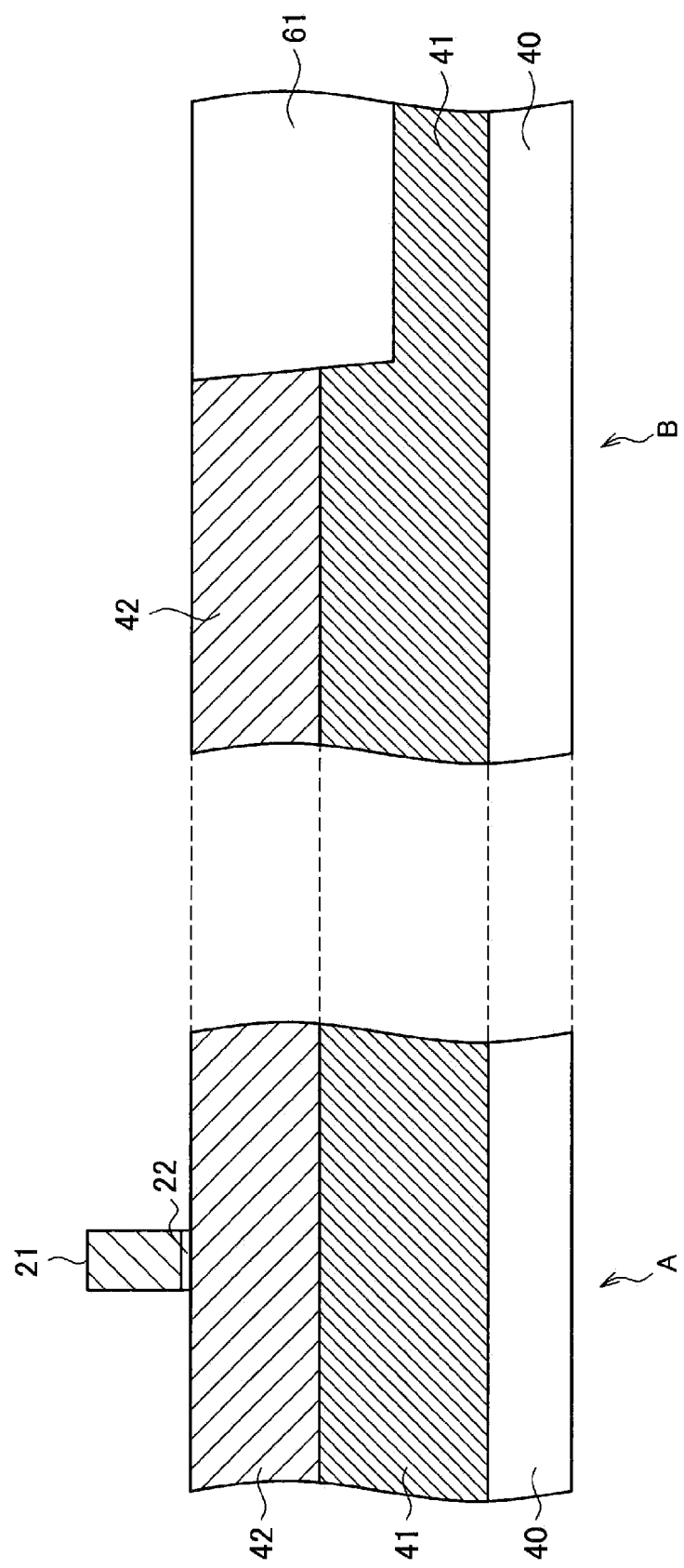
FIG. 5 is a cross-sectional view describing each manufacturing process of the semiconductor storage element according to this embodiment.

Next, as illustrated in FIG. 5, after the insulating layer 71 is removed, the gate insulator film 22 is formed, and the gate electrode 21 is formed on the gate insulator film 22.

Specifically, after the insulating layer 71 is peeled off using hydrofluoric acid solution or the like, first of all, a base including $SiO_2$ is formed into a film thickness of 0.5 nm to 1.5 nm using Rapid Thermal Oxidization (RTO) treatment, oxygen plasma treatment, treatment using hydrogen peroxide containing chemical solution, or the like. Subsequently, hafnium oxide ($HfO_x$) being a high-dielectric member is formed into a film by the CVD method, an Atomic Layer Deposition (ALD) method, or the like. The gate insulator film 22 is thereby formed.

Note that, zirconium oxide ($ZrO_x$), hafnium zirconium oxide ($HfZrO_x$), or the like can be used in place of the hafnium oxide. In addition, these high-dielectric members may be doped with lanthanum (La), silicon (Si), gadolinium (Gd), or the like.

Next, after TiN is formed into a film thickness of 5 nm to 20 nm using a sputtering method, the CVD method, the ALD method, or the like, polysilicon is formed into a film having a film thickness of 50 nm to 150 nm, by the low-pressure CVD method that uses $SiH_4$ gas. Furthermore, by performing anisotropic etching using a resist patterned by the lithography, as a mask, the gate electrode 21 is formed. Note that, TaN or the like can be used in place of TiN of the gate electrode 21.

The anisotropic etching can be performed by dry etching that uses HBr or Cl-based gas, for example. In addition, a width of the gate electrode 21 to be formed after the anisotropic etching can be made thinner by performing trimming treatment of the resist by $O_2$ plasma after patterning the resist. For example, in a 32-nm process node, a width (gate length) of the gate electrode 21 may be set to 20 nm to 30 nm.

Figure 6:
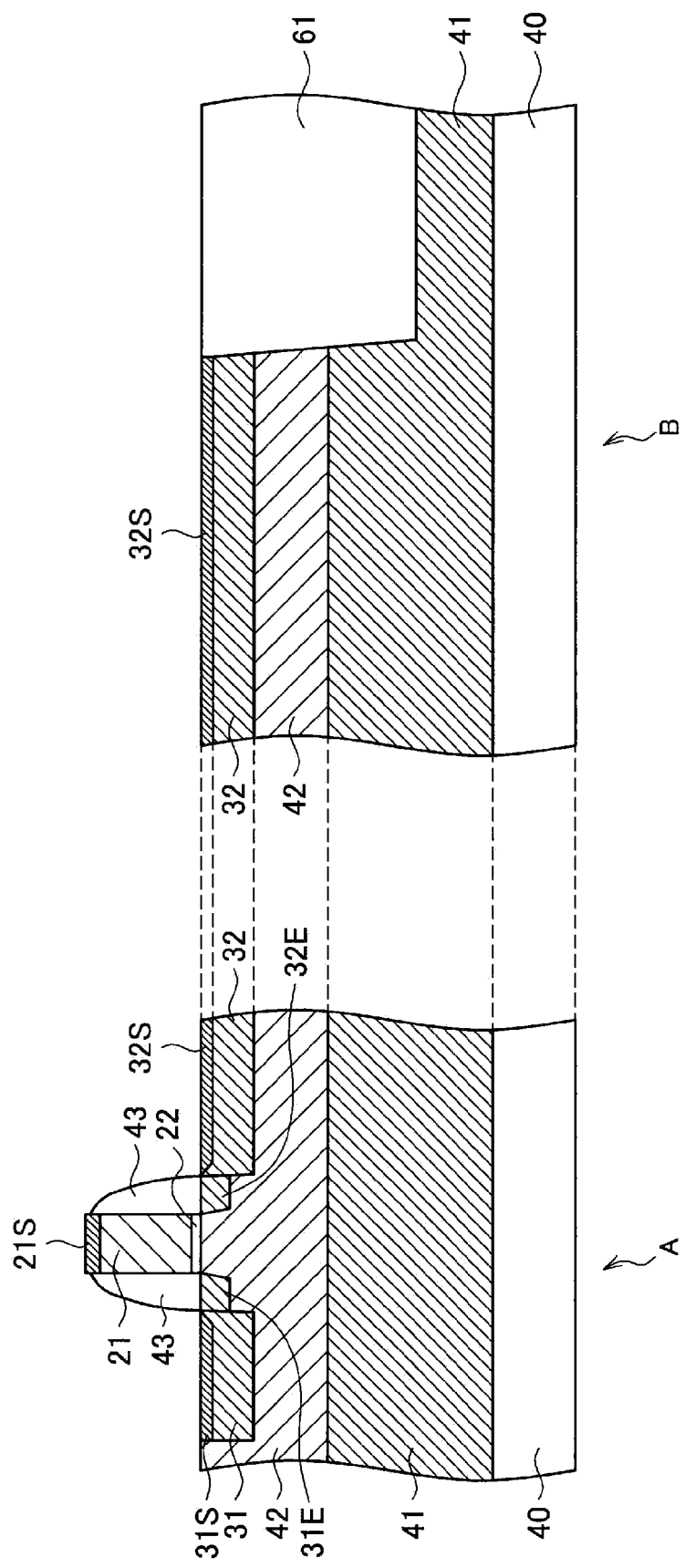
FIG. 6 is a cross-sectional view describing each manufacturing process of the semiconductor storage element according to this embodiment.

Next, as illustrated in FIG. 6, after the extension regions 31E and 32E, the drain region 31, and the source region 32 are formed in a self-aligning manner by utilizing the side wall insulating films 43, the contact regions 31S, 32S, and 21S are formed.

Specifically, the side wall insulating films 43 are partially formed on the side surfaces of the gate electrode 21 by performing the anisotropic etching after forming $Si_3N_4$ into films having a film thickness of 5 nm to 15 nm, by the low-pressure CVD method. After that, the extension regions 31E and 32E are formed by ion-implanting an impure substance of the second conductivity type (phosphorus, arsenic, etc.) at concentration of 5 to $20 \times 10^{14}/cm^2$ at 5 keV to 10 keV. The extension regions 31E and 32E are thereby formed at positions offset from the gate electrode 21 by an amount corresponding to the width of the $Si_3N_4$ films formed on the side surfaces of the gate electrode 21. The formed extension regions 31E and 32E can suppress variations in properties of field effect transistors by suppressing a short channel effect.

Subsequently, the side wall insulating films 43 are formed on the side surfaces of the gate electrode 21 by performing the anisotropic etching after forming $SiO_2$ into films having a film thickness of 10 nm to 30 nm, by the plasma CVD method, and further forming $Si_1N_4$ into films with 30 nm to 50 nm by the plasma CVD method. After that, the drain region 31 and the source region 32 are formed by ion-implanting an impure substance of the second conductivity type (phosphorus, arsenic, etc.) at concentration of 1 to $2 \times 10^{15}/cm^2$ at 40 keV to 50 keV. Furthermore, by performing Rapid Thermal Annealing (RTA) for five seconds at 1000° C., the ion-implanted impure substance is activated. Note that, for suppressing diffusion of the impure substance to an unintended region, activation of the impure substance can also be performed by spike RTA.

Furthermore, by forming nickel (Ni) into a film having a film thickness of 6 nm to 8 nm, by the sputtering method, and then performing the RTA for ten seconds to 60 seconds at 300° C. to 450° C., the nickel (Ni) on the drain region 31, the source region 32, and the gate electrode 21 is combined with silicon (Si) (so-called silicidation is performed), and the low-resistance contact regions 31S, 32S, and 21S are formed. Unreacted Ni on the element separation layer 61 or the like is removed using $H_2SO_4/H_2O_2$. In addition, the contact regions 31S, 32S, and 21S that include $CoSi_2$ or NiSi can also be formed by forming cobalt (Co) or nickel platinum (NiPt) into a film, in place of Ni. Note that, the condition of RTA can be appropriately set in accordance with metal to be made into a silicide.

Note that, simultaneously with the above processes, a field effect transistor constituting a logic circuit such as a CMOS can also be formed in a region different from the region in which the semiconductor storage element 1 is to be formed region. An LSI on which a memory that uses the semiconductor storage element 1, and a logic circuit such as a CMOS are mixedly mounted can be thereby manufactured through a smaller number of processes. In this case, in the field effect transistor constituting the logic circuit, a gate insulator film is formed not by a ferroelectric but by insulating material such as oxidized film.

Figure 7:
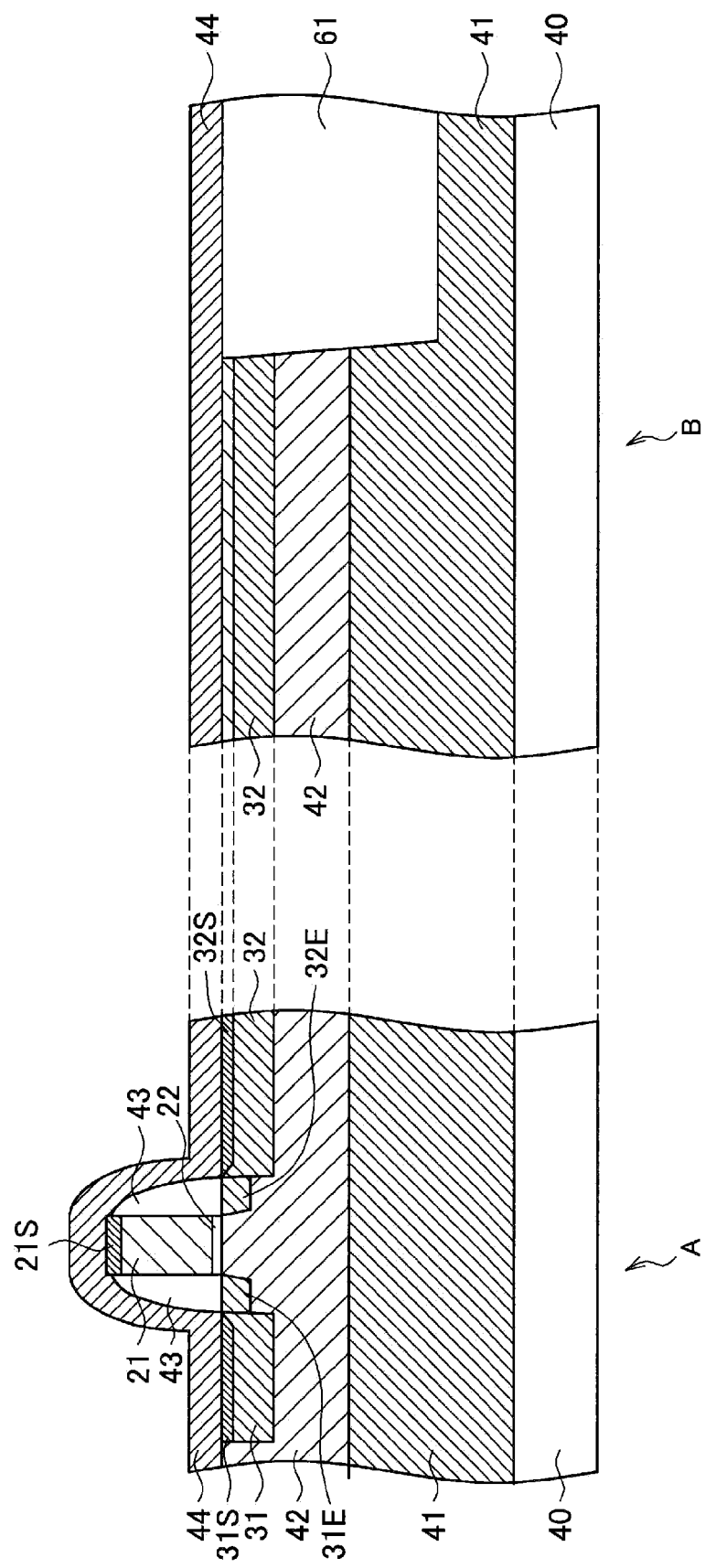
FIG. 7 is a cross-sectional view describing each manufacturing process of the semiconductor storage element according to this embodiment.

Next, as illustrated in FIG. 7, the liner layer 44 is formed over the entire surfaces on the first semiconductor layer 42, the gate electrode 21, and the element separation layer 61.

Specifically, the liner layer 44 including SiN is formed into a film thickness of 10 nm to 50 nm by the plasma CVD method. In addition, the liner layer 44 can also be formed by the low-pressure CVD method or the ALD method.

Note that, the liner layer 44 can also be formed as a layer that adds compressional stress or tensile stress.

For example, in the case of forming the liner layer 44 as a layer that adds tensile stress, film formation can be performed by supplying nitrogen ($N_2$) gas (500 $cm^3$/min to 2000 $cm^3$/min), ammonia ($NH_3$) gas (500 $cm^3$/min to 1500 $cm^3$/min), and mono-silane ($SiH_4$) gas (50 $cm^3$/min to 300 $cm^3$/min) into a chamber, setting a temperature of the semiconductor substrate 40 to 200° C. to 400° C., setting film formation pressure to 0.67 kPa to 2.0 kPa, setting RF power to 50 W to 500 W, and causing chemical reaction by the plasma CVD method. Furthermore, after the film formation, by supplying helium (He) gas (10 L/min to 20 L/min), setting a temperature to 400° C. to 600° C., setting pressure to 0.67 kPa to 2.0 kPa, and performing Ultra Violet (UV) irradiation treatment using lamp power of 1 kW to 10 kW, the liner layer 44 that adds tensile stress can be formed.

In addition, in the case of forming the liner layer 44 as a layer that adds compressional stress, the liner layer 44 that adds compressional stress can be formed by performing film formation by supplying hydrogen ($H_2$) gas (1000 $cm^3$/min to 5000 $cm^3$/min), nitrogen ($N_2$) gas (500 $cm^3$/min to 2500 $cm^3$/min), argon (Ar) gas (1000 $cm^3$/min to 5000 $cm^3$/min), ammonia ($NH_3$) gas (50 $cm^3$/min to 250 $cm^3$/min), and trimethylsilane (($CH_3$)$_3$SiH) gas (10 $cm^3$/min to 50 $cm^3$/min) into a chamber, setting a temperature of the semiconductor substrate 40 to 400° C. to 600° C., setting film formation pressure to 0.13 kPa to 0.67 kPa, setting RF power to 50 W to 500 W. and causing chemical reaction by the plasma CVD method.

Nevertheless, the above is merely an example, and a formation condition, stress, and a film thickness of the liner layer 44 of the semiconductor storage element 1 according to the present embodiment is not limited to the above.

Figure 8:
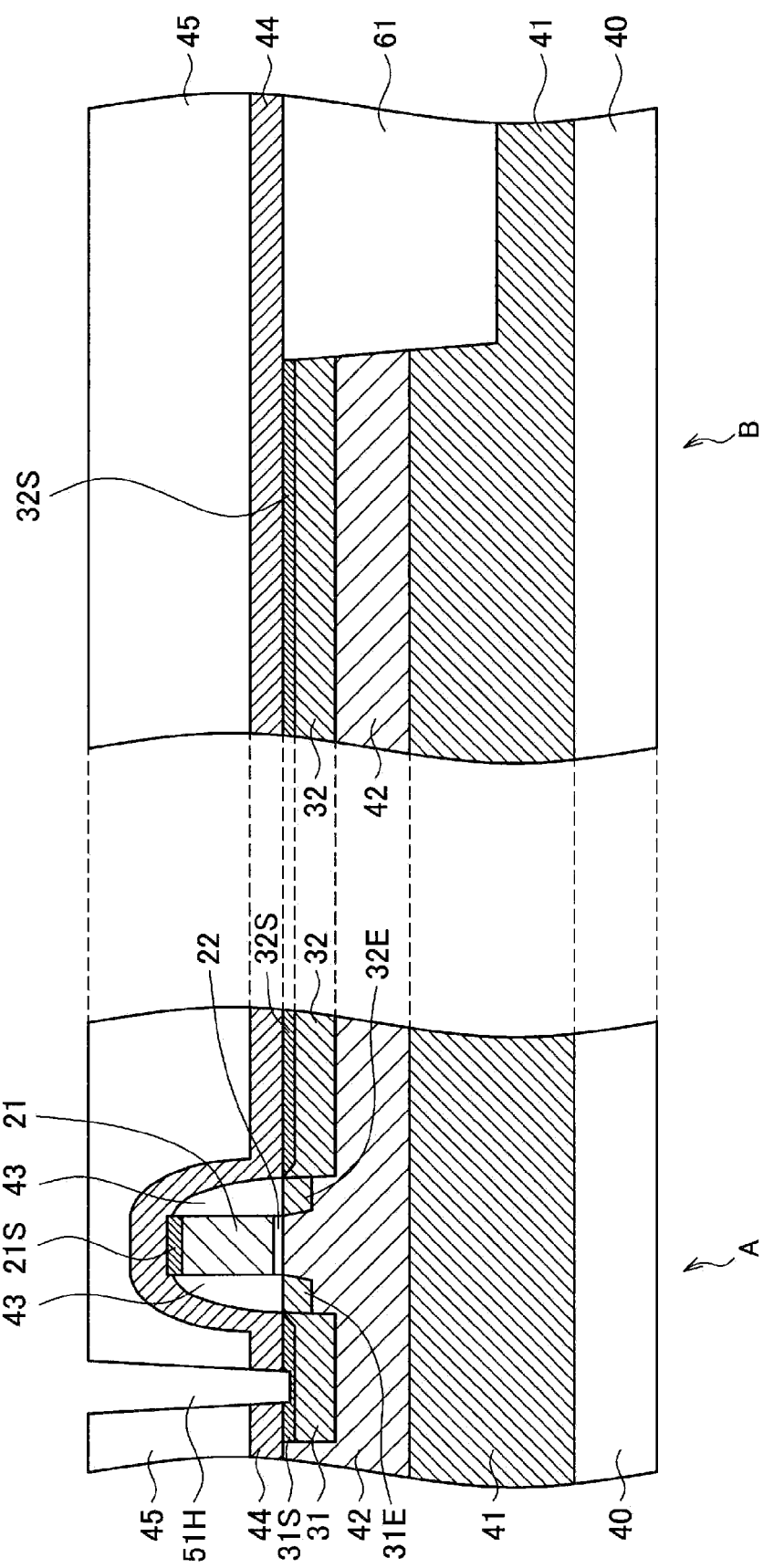
FIG. 8 is a cross-sectional view describing each manufacturing process of the semiconductor storage element according to this embodiment.

Subsequently, as illustrated in FIG. 8, after the planarization film 45 is formed, an opening 51H in which the contact plug 51 connecting with the drain region 31 is to be formed is formed.

Specifically, after the planarization film 45 is formed by forming $SiO_2$ into a film having a film thickness of 500 nm to 1500 nm, by the CVD method, planarization is performed by the CMP method. Subsequently, by etching the planarization film 45 and the liner layer 44, the opening 51H is formed above the drain region 31, and the contact region 31S is exposed.

Figure 9:
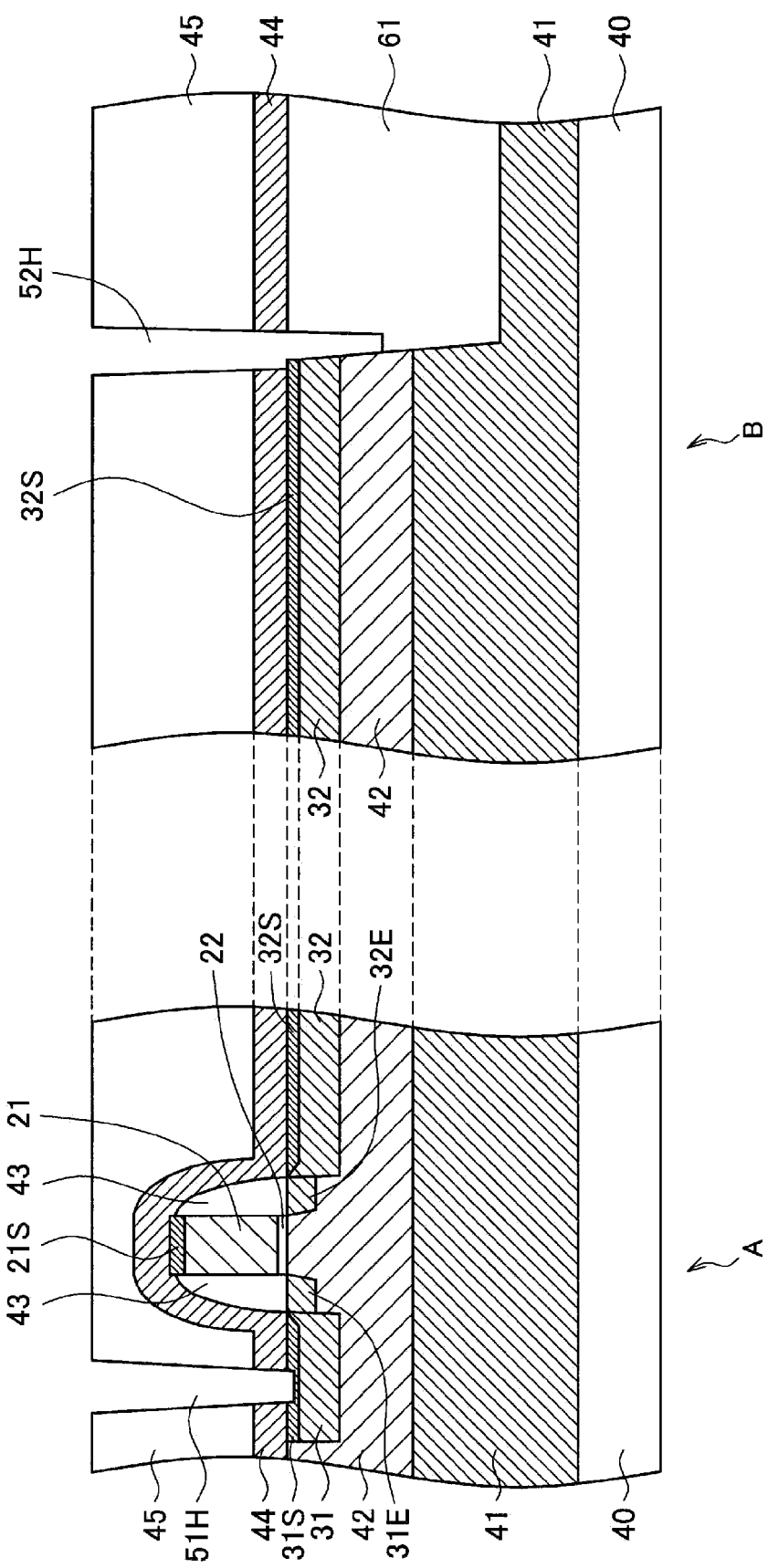
FIG. 9 is a cross-sectional view describing each manufacturing process of the semiconductor storage element according to this embodiment.

Next, as illustrated in FIG. 9, an opening 52H in which the contact plug 52 connecting with the source region 32 and the first semiconductor layer 42 is to be formed is formed.

Specifically, by etching the planarization film 45, the liner layer 44, and the element separation layer 61, the opening 52H is formed near the boundary between the first semiconductor layer 42 and the element separation layer 61, and the side surfaces of the contact region 32S, the source region 32, and the first semiconductor layer 42 are exposed.

Here, the opening 52H is formed so as not to reach the second semiconductor layer 41. The foregoing opening 52H can be formed with good controllability by performing etching while dividing the etching into a plurality of times by, for example, performing etching up to the top of the liner layer 44 in etching in which $SiO_2$/SiN has a high selection ratio, and then, performing etching up to the first semiconductor layer 42.

Figure 10:
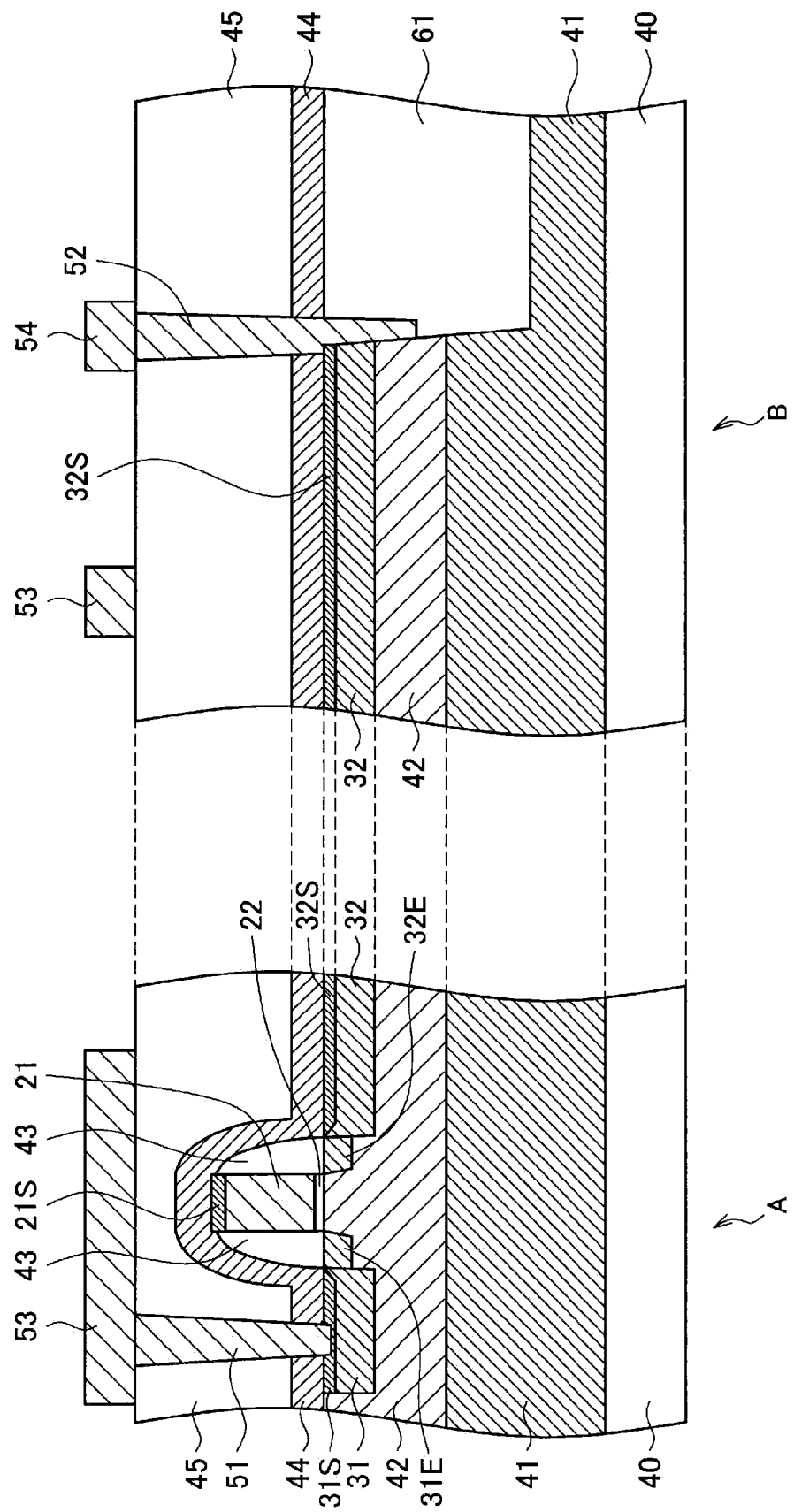
FIG. 10 is a cross-sectional view describing each manufacturing process of the semiconductor storage element according to this embodiment.

Next, as illustrated in FIG. 10, after the contact plugs 51 and 52 are formed in the respective openings 51H and 52H, by wiring the data line 53, the bit line 54, and the word line 55 (not illustrated), the semiconductor storage element 1 is formed.

Specifically, by forming titanium (Ti) and titanium nitride (TIN) into films in the openings 51H and 52H by the CVD method, and then, forming tungsten (W) into films, and performing planarization by the CMP method, the contact plugs 51 and 52 are formed. Note that, Ti and TiN may be formed into films by the sputtering method or the like that uses Ion Metal Plasma (IMP). In addition, planarization may be performed using whole surface etch back in place of the CMP method.

Subsequently, by a damascene method, wiring is performed using copper (Cu), and the data line 53, the bit line 54, and the word line 55 (not illustrated) are formed. In addition, in a case where a logic circuit such as a CMOS circuit is formed in the semiconductor substrate 40, wiring of the logic circuit can be simultaneously performed. Wiring of the data line 53, the bit line 54, the word line 55 (not illustrated), and the like may be multilayer wiring, and may appropriately employ an applicable configuration. In addition, these wires may be formed by aluminum (Al).

According to the above processes, the semiconductor storage element 1 according to the present embodiment can be formed.

[1.4. Modified Example]

Figure 11:
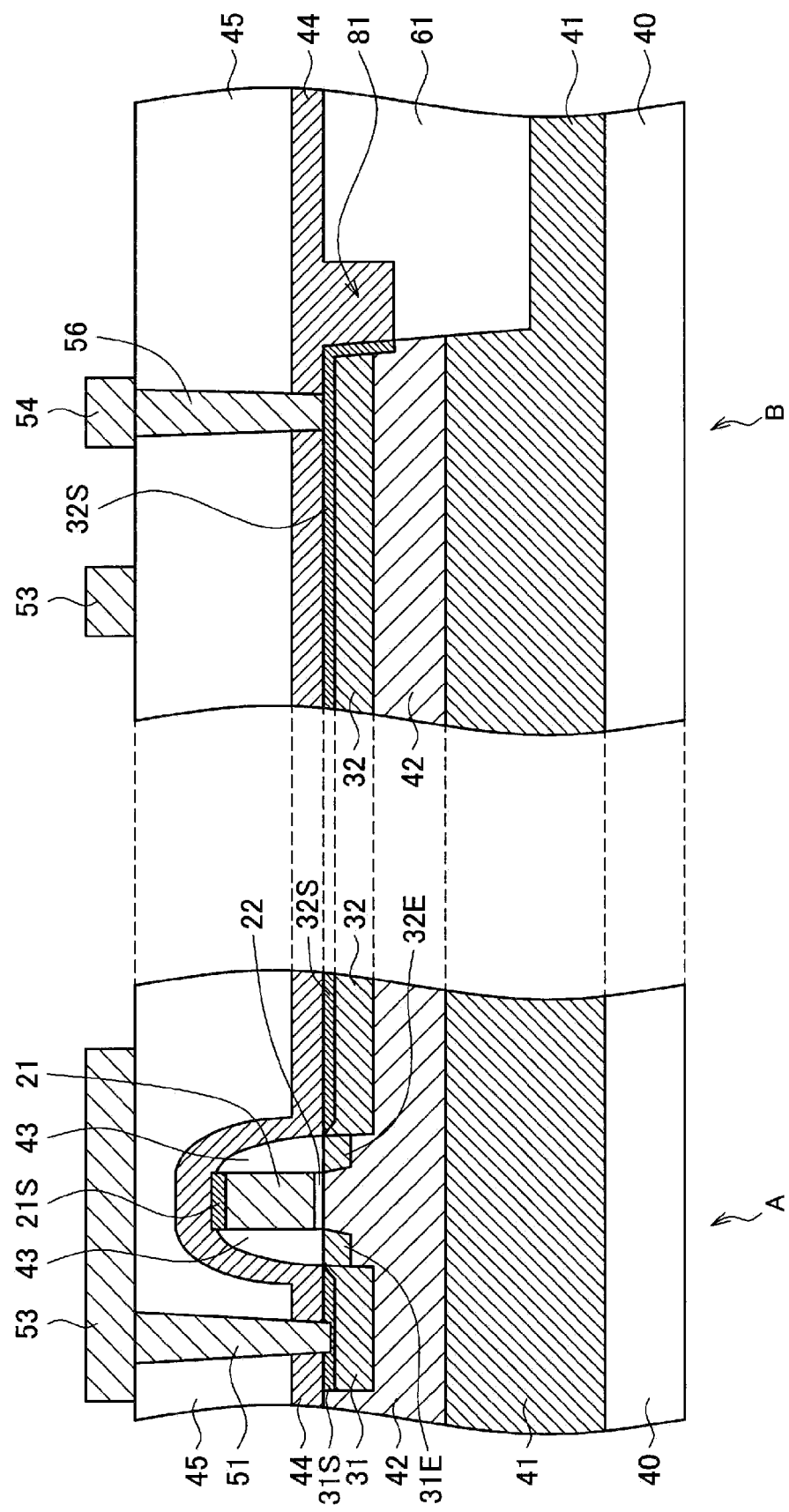
FIG. 11 is a cross-sectional view illustrating a layer stack structure of a semiconductor storage element according to a modified example of this embodiment.
Figure 12:
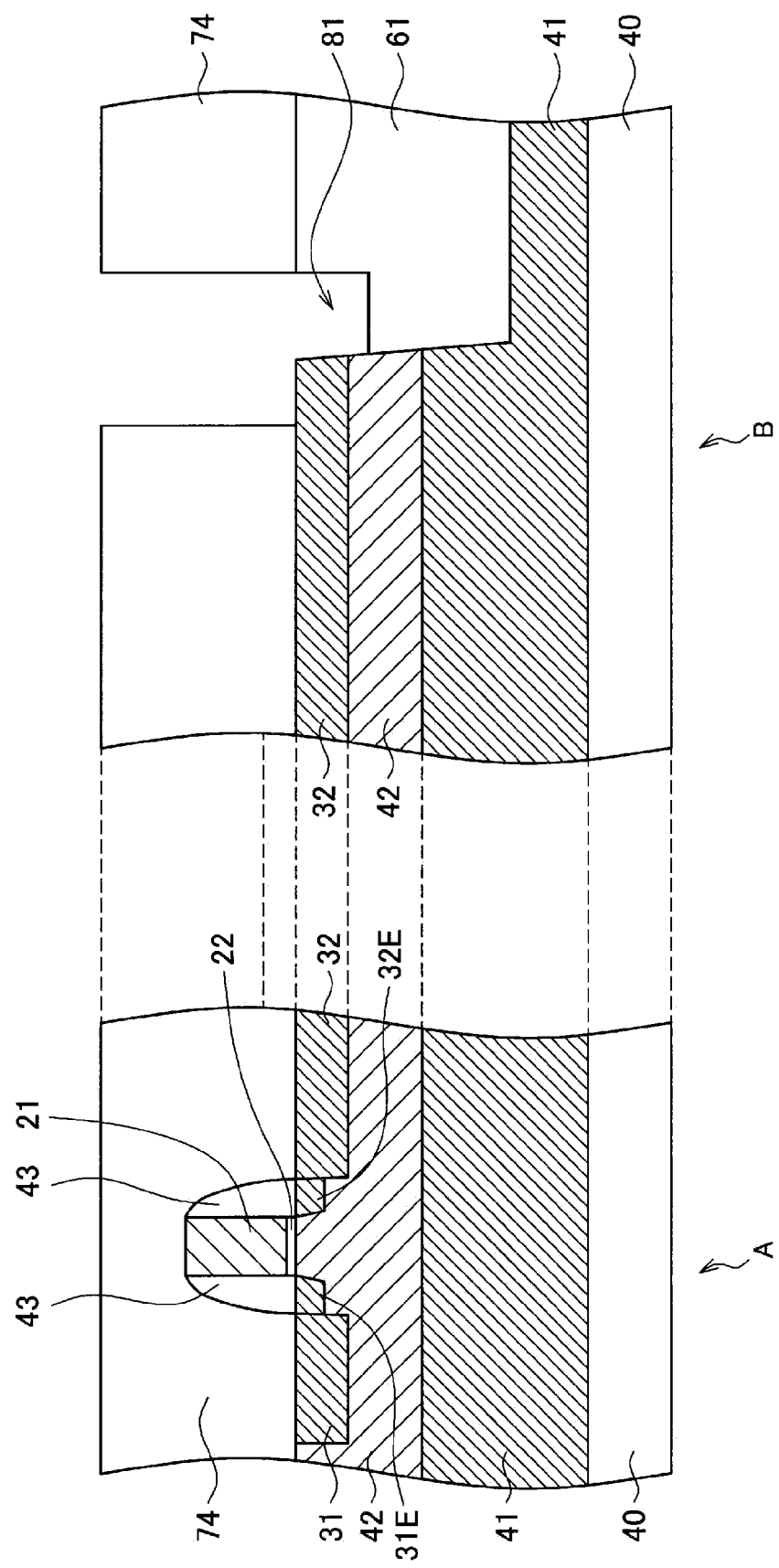
FIG. 12 is a cross-sectional view describing each manufacturing process of the semiconductor storage element according to this modified example.

Subsequently, a structure and a manufacturing method of a semiconductor storage element according to a modified example of the present embodiment will be described with reference to FIGS. 11 to 13. FIG. 11 is a cross-sectional view illustrating a layer stack structure of a semiconductor storage element according to this modified example. Note that, a cross-section indicated by "A" in FIG. 11 illustrates a cross-section cut along the AA line in FIG. 1, and a cross-section indicated by "B" in FIG. 11 illustrates a cross-section cut along the BB line in FIG. 1.

Note that, because configurations other than the configurations to be described below are substantially similar to the configuration described in FIG. 2 with being denoted with the same reference numerals, the description here will be omitted.

As illustrated in FIG. 11, in the semiconductor storage element according to this modified example, a part of the element separation layer 61 that is in contact with the first semiconductor layer 42 is removed and an opening 81 is provided, and the contact region 32S is provided from the front surface of the source region 32 over the side surface of the first semiconductor layer 42 that faces the opening 81. In addition, the opening 81 provided in the element separation layer 61 is filled by the liner layer 44 provided on the first semiconductor layer 42.

The opening 81 is provided in the element separation layer 61 in a region that is in contact with the first semiconductor layer 42, and exposes the side surfaces of the source region 32 and the first semiconductor layer 42. By providing the opening 81, as described later, it becomes possible to form the contact region 32S from the front surface of the source region 32 over the side surface of the first semiconductor layer 42.

Here, a depth of the opening 81 is set to a depth of such a degree that the side surface of the second semiconductor layer 41 is not exposed. In a case where the side surface of the second semiconductor layer 41 is exposed by the opening 81, the contact region 32S is formed from the front surface of the source region 32 over the side surfaces of the first semiconductor layer 42 and the second semiconductor layer 41. This can possibly cause voltage applied to a contact plug 56, to interfere with an adjacent semiconductor storage element via the second semiconductor layer 41, which is not preferable.

The contact region 32S is formed by an alloy of high melting point metal such as Ni, and a semiconductor constituting the first semiconductor layer 42, and is formed by a high melting point metal silicide such as NiSi, for example. In other words, the contact region 32S is formed by forming high melting point metal such as Ni into a film on the first semiconductor layer 42, and performing alloying.

Thus, by forming high melting point metal such as Ni into a film on the first semiconductor layer 42, after providing the opening 81 in the element separation layer 61, the contact region 32S can be formed also on the exposed side surfaces of the source region 32 and the first semiconductor layer 42. The contact region 32S can be thereby formed from the front surface of the source region 32 over the side surface of the first semiconductor layer 42 that faces the opening 81. By the contact region 32S, a low-resistance conduction path can be formed from the contact plug 56 to the source region 32 and the first semiconductor layer 42.

The contact plug 56 is provided with penetrating through the liner layer 44 and the planarization film 45, and electrically connects the bit line 54 and the source region 32 by coming into contact with the contact region 32S. In addition, the contact plug 56 can electrically connect the bit line 54 and the first semiconductor layer 42 via the contact region 32S. Similarly to the contact plug 51, the contact plug 56 may be formed by low-resistance metal such as titanium (Ti) or tungsten (W), or a metal compound such as titanium nitride (TiN), for example. In addition, the contact plug 56 may be formed into a layer stack structure including a plurality of layers, and may be formed into a layer stack structure including Ti or TiN, and W, for example.

According to the semiconductor storage element according to this modified example, even without bringing the contact plug 56 into direct contact with the first semiconductor layer 42, the first semiconductor layer 42 and the bit line 54 can be electrically connected via the contact region 32S provided with extending up to the side surface of the first semiconductor layer 42.

Subsequently, a manufacturing method of the semiconductor storage element according to this modified example will be described with reference to FIGS. 12 and 13. FIGS. 12 and 13 are cross-sectional views describing manufacturing processes of the semiconductor storage element according to this modified example.

First of all, processes similar to the processes described using FIGS. 3 to 5 are performed. After that, as illustrated in FIG. 6, after the extension regions 31E and 32E, the drain region 31, and the source region 32 are formed in a self-aligning manner by utilizing the side wall insulating films 43, a patterned resist layer 74 is formed on the first semiconductor layer 42 and the element separation layer 61.

Specifically, the side wall insulating films 43 are partially formed on the side surfaces of the gate electrode 21 by performing the anisotropic etching after forming $Si_3N_4$ into films having a film thickness of 5 nm to 15 nm, by the low-pressure CVD method. After that, the extension regions 31E and 32E are formed by ion-implanting an impure substance of the second conductivity type (phosphorus, arsenic, etc.) at concentration of 5 to $20 \times 10^{14}/cm^2$ at 5 keV to 10 keV. The extension regions 31E and 32E are thereby formed at positions offset from the gate electrode 21 by an amount corresponding to the width of the $Si_3N_4$ films formed on the side surfaces of the gate electrode 21.

Subsequently, the side wall insulating films 43 are formed on the side surfaces of the gate electrode 21 by performing the anisotropic etching after forming $SiO_2$ into films having a film thickness of 10 nm to 30 nm, by the plasma CVD method, and further forming $Si_3N_4$ into films with 30 nm to 50 nm by the plasma CVD method. After that, the drain region 31 and the source region 32 are formed by ion-implanting an impure substance of the second conductivity type (phosphorus, arsenic, etc.) at concentration of 1 to $2 \times 10^{15}/cm^2$ at 40 keV to 50 keV. Furthermore, by performing the Rapid Thermal Annealing (RTA) for five seconds at 1000° C., the ion-implanted impure substance is activated. Note that, for suppressing diffusion of the impure substance to an unintended region, activation of the impure substance can also be performed by the spike RTA.

Next, after the resist layer 74 is formed on the first semiconductor layer 42 and the element separation layer 61 by a spin coating method or the like, patterning is performed using photolithography so that the vicinity of the boundary between the first semiconductor layer 42 and the element separation layer 61 is opened. Furthermore, by performing etching using wet etching that uses hydrofluoric acid, or dry etching having a high selection ratio of $Si/SiO_2$, only the element separation layer 61 exposed by the opening of the resist layer 74 is etched, and the opening 81 is formed in the element separation layer 61. At this time, it is preferable to control the depth of the opening 81 to such a degree that the side surface of the second semiconductor layer 41 is not exposed, by appropriately controlling an etching rate and the like.

Figure 13:
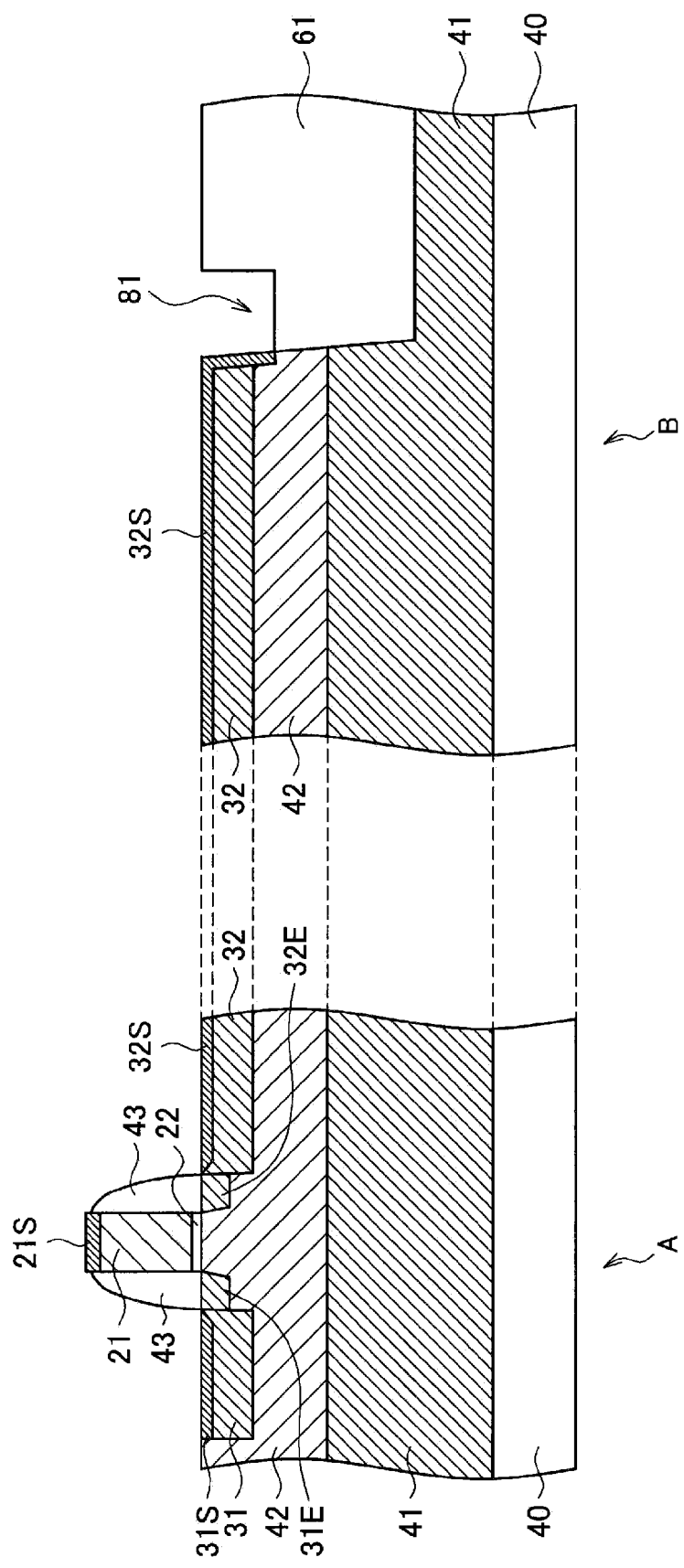
FIG. 13 is a cross-sectional view describing each manufacturing process of the semiconductor storage element according to this modified example.

Next, as illustrated in FIG. 13, after the resist layer 74 is removed, the contact regions 31S, 32S, and 21S are formed.

Specifically, first of all, the resist layer 74 of the first semiconductor layer 42 and the element separation layer 61 is removed. Subsequently, by forming nickel (Ni) into a film having a film thickness of 6 nm to 8 nm, by the sputtering method, and then performing the RTA for ten seconds to 60 seconds at 300° C. to 450° C., the nickel (Ni) on the drain region 31, the source region 32, and the gate electrode 21 is combined with silicon (Si) (so-called silicidation is performed), and the low-resistance contact regions 31S, 32S, and 21S are formed. Here, in the semiconductor storage element according to this modified example, the side surfaces of the source region 32 and the first semiconductor layer 42 are exposed by the opening 81. Thus, the contact region 32S is formed from the front surface of the source region 32 over the side surface of the first semiconductor layer 42.

Furthermore, unreacted Ni on the element separation layer 61 or the like is removed using $H_2SO_4/H_2O_2$. In addition, the contact region 31S, 32S, and 21S that include $CoSi_2$ or NiSi can also be formed by forming cobalt (Co) or nickel platinum (NiPt) into a film, in place of Ni. Note that, the condition of RTA can be appropriately set in accordance with metal to be made into a silicide.

Subsequently, by going through processes similar to the processes described using FIGS. 7 to 10, the semiconductor storage element according to this modified example can be formed.

2. SECOND EMBODIMENT

Figure 14:
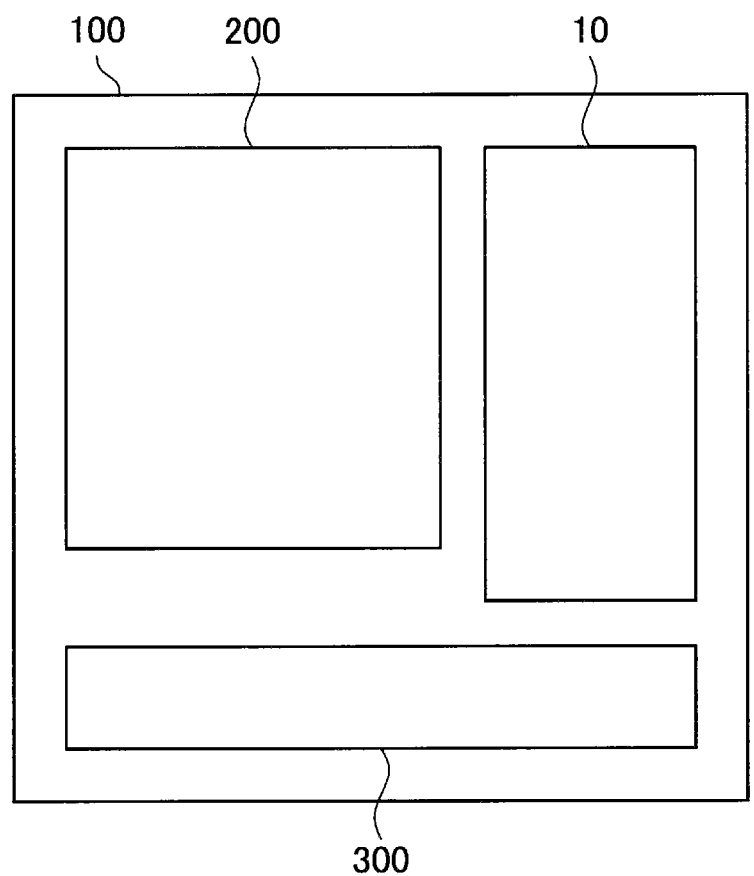
FIG. 14 is a plan view illustrating a planar structure of a semiconductor device according to a second embodiment of the present disclosure.

Next, a planar structure of a semiconductor device according to a second embodiment of the present disclosure will be described with reference to FIG. 14. FIG. 14 is a plan view illustrating a planar structure of a semiconductor device 100 according to the present embodiment.

As illustrated in FIG. 14, the semiconductor device 100 according to the present embodiment is an LSI or the like on which the storage device 10, a logic circuit 200, and a control circuit 300 are mixedly mounted on one substrate (chip), for example. Such an LSI on which a plurality of types of circuits are mixedly mounted on one chip is also referred to as a System on a Chip (SoC), for example. In addition, an analog circuit may be mixedly mounted on the semiconductor device 100 according to the present embodiment. For example, a Radio Frequency (RF) circuit, a power circuit, an Input/Output (I/O) port, a sensor, other memory circuits, or the like may be mixedly mounted on the semiconductor device 100 according to the present embodiment.

The storage device 10 is a storage device including the semiconductor storage element 1 according to the first embodiment. Specifically, the storage device 10 is a storage device in which the plurality of semiconductor storage elements 1 according to the first embodiment are arranged in a matrix, and stores various parameters and programs that are used in the logic circuit 200, for example.

The logic circuit 200 is an arithmetic processing circuit including a complementary MOS (CMOS) circuit including an n-type MOSFET and a p-type MOSFET, for example. For example, the logic circuit 200 performs arithmetic processing of information on the basis of the various parameters and programs that are stored in the storage device 10. The control circuit 300 controls the logic circuit 200 and the storage device 10 being configurations of the semiconductor device 100.

According to the semiconductor device 100 according to the present embodiment, various circuits having different functions can be collectively mounted on one chip. The semiconductor device 100 can therefore be downsized more. In addition, according to the semiconductor device 100 according to the present embodiment, as compared with a case where various circuits are provided on different chips, a wiring length can be made shorter. Thus, operation speed can be increased to higher speed while reducing power consumption.

In addition, in the semiconductor device 100 according to the present embodiment, the logic circuit 200 may be provided on a region in which an insulating layer and a semiconductor layer are sequentially stacked on a support substrate. A structure in which an insulating layer and a semiconductor layer are sequentially stacked on a semiconductor substrate being a support substrate is also referred to as a Silicon On Insulator (SOI) structure, and floating capacitance of the semiconductor substrate that is generated when a field effect transistor is formed can be reduced by burying the insulating layer under the semiconductor layer. In addition, leak current can be prevented from occurring from a drain electrode to the semiconductor substrate in a case where the field effect transistor is operated.

Note that, the SOI structure is sorted into a Full Depleted SOI (FDSOI) in which a film thickness of a semiconductor layer on an insulating layer is 5 nm to 20 nm or less, and a Partial Depleted SOI (PDSOI) in which a film thickness of a semiconductor layer on an insulating layer is thicker than 20 nm. The semiconductor device 100 according to the present embodiment can use both of them.

[2.2. Layer Stack Structure of Semiconductor Device]

Figure 15:
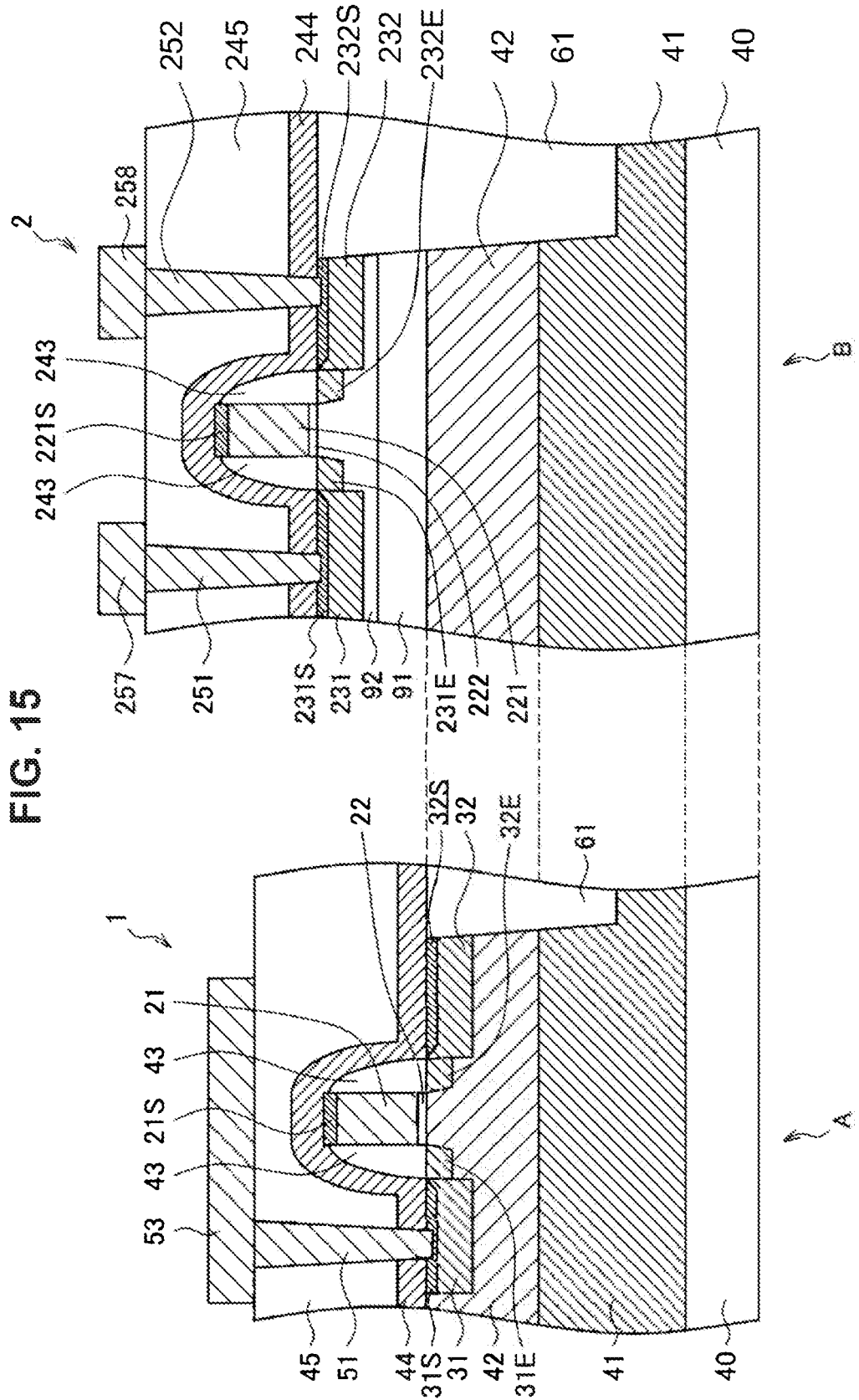
FIG. 15 is a cross-sectional view illustrating a layer stack structure of a field effect transistor provided in the semiconductor device according to this embodiment.

Subsequently, a layer stack structure of the semiconductor device 100 according to the present embodiment will be described with reference to FIG. 15. FIG. 15 is a cross-sectional view illustrating a layer stack structure of a field effect transistor provided in the semiconductor device 100 according to the present embodiment. Note that, a cross-section indicated by "A" in FIG. 15 illustrates a cross-section obtained by cutting a field effect transistor to be provided in the storage device 10, and a cross-section indicated by "B" in FIG. 15 illustrates a cross-section obtained by cutting a field effect transistor 2 to be provided in the logic circuit 200 or the like.

As illustrated in FIG. 15, among the field effect transistors to be provided in the semiconductor device 100 according to the present embodiment, the field effect transistor to be provided in the storage device 10 (i.e, the semiconductor storage element 1) is as described in the first embodiment. Thus, the description here will be omitted.

On the other hand, the field effect transistor 2 to be provided in the logic circuit 200 is provided further on a buried insulating layer 91 and a third semiconductor layer 92 that are sequentially stacked on the first semiconductor layer 42.

The field effect transistor 2 may be a general field effect transistor, and the structure is not specifically limited. For example, the field effect transistor 2 may have a structure similar to that of the field effect transistor to be provided in the storage device 10 (i.e., the semiconductor storage element 1). In such a case, because the field effect transistor 2 can be formed simultaneously with the semiconductor storage element 1, a manufacturing process can be shortened.

More specifically, the field effect transistor 2 includes a gate electrode 221 provided on the third semiconductor layer 92 via a gate insulator film 222, a drain region 231 and a source region 232 that are provided on the third semiconductor layer 92 on the both sides across the gate electrode 221, extension regions 231E and 232E that are provided between the drain region 231 and the source region 232, and the gate electrode 221, and contact regions 231S, 232S, and 221S that are respectively provided on the front surfaces of the drain region 231, the source region 232, and the gate electrode 221. In addition, side wall insulating films 243 are provided on the side surfaces of the gate electrode 221, and the gate electrode 221 and the third semiconductor layer 92 are covered by a liner layer 244 and a planarization film 245. Furthermore, a drain electrode 257 is connected to the contact region 231S of the drain region 231 via a contact plug 251, and a source electrode 258 is connected to the contact region 232S of the source region 232 via a contact plug 252.

Because these configurations are substantially similar to the configuration described in FIG. 2, the description here will be omitted. Nevertheless, the gate insulator film 222 of the field effect transistor 2 is formed not by ferroelectric material but by insulating material such as silicon oxide ($SiO_2$).

The buried insulating layer 91 is provided inside the semiconductor substrate 40, and is formed by insulating material. In other words, the third semiconductor layer 92 is provided in the semiconductor substrate 40 on the upper side of the buried insulating layer 91, and the first semiconductor layer 42 and the second semiconductor layer 41 are provided in the semiconductor substrate 40 on the lower side of the buried insulating layer 91. For example, the buried insulating layer 91 may be an oxide layer obtained by oxidizing a partial layer of the semiconductor substrate 40 by ion-implanting of oxygen. In addition, the buried insulating layer 91 may be an oxide layer sandwiched by the semiconductor substrate 40 by being formed on the front surface of the semiconductor substrate, and then being stuck to another semiconductor substrate.

The third semiconductor layer 92 is a layer of the first conductivity type, and is provided in the semiconductor substrate 40 on the upper side of the buried insulating layer 91. Specifically, the third semiconductor layer 92 is formed by introducing an impure substance of the first conductivity type (e.g. p-type impure substance such as boron (B)) to the upper side of the buried insulating layer 91 of the semiconductor substrate 40.

The field effect transistor 2 is provided on a region in which the buried insulating layer 91 is provided. Because the buried insulating layer 91 is provided, the field effect transistor 2 can cut down floating capacitance generated between the third semiconductor layer 92. In addition, because the buried insulating layer 91 is provided with, the field effect transistor 2 can prevent leak current from flowing from the third semiconductor layer 92 to the first semiconductor layer 42.

Note that, the field effect transistor constituting the semiconductor storage element 1 needs not be provided on the buried insulating layer 91. Additionally, in an FDSOI substrate in which a film thickness of the third semiconductor layer 92 is 5 nm to 20 nm, because the drain region 31 and the source region 32 are formed up to a region contacting the buried insulating layer 91, it becomes difficult to electrically connect to the third semiconductor layer 92 immediately below the gate insulator film 22. Thus, it is preferable not to use the FDSOI substrate in a region in which the field effect transistor constituting the semiconductor storage element 1 is to be provided.

[2.3. Manufacturing Method of Semiconductor Device]

Next, a manufacturing method of the semiconductor device 100 according to the present embodiment will be described with reference to FIGS. 16 to 21. FIGS. 16 to 21 are cross-sectional views describing manufacturing processes of the semiconductor device 100 according to the present embodiment. Note that, in FIGS. 16 to 21, similarly to FIG. 15, only the field effect transistor to be provided in the storage device 10, and the field effect transistor 2 to be provided in the logic circuit 200 or the like are illustrated.

Figure 16:
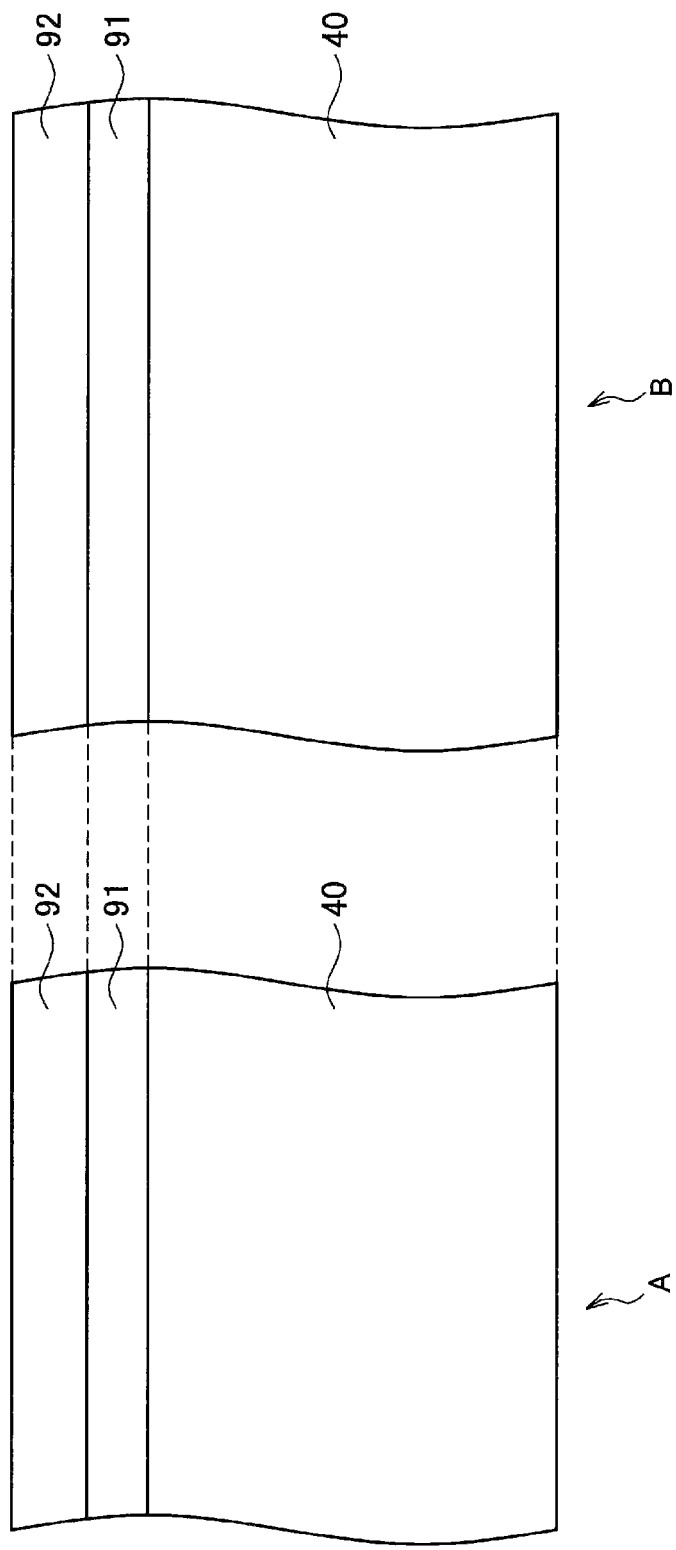
FIG. 16 is a cross-sectional view describing each manufacturing process of the semiconductor device according to this embodiment.

First of all, as illustrated in FIG. 16, the semiconductor substrate 40 (so-called SOI substrate) on which the buried insulating layer 91 and the third semiconductor layer 92 are sequentially stacked is prepared. For example, compositions of the semiconductor substrate 40 and the third semiconductor layer 92 are Si, and a composition of the buried insulating layer 91 may be $SiO_2$. Note that, a film thickness of the third semiconductor layer 92 is not specifically limited, and the semiconductor substrate 40 may be an FDSOI substrate or may be a PDSOI substrate.

Figure 17:
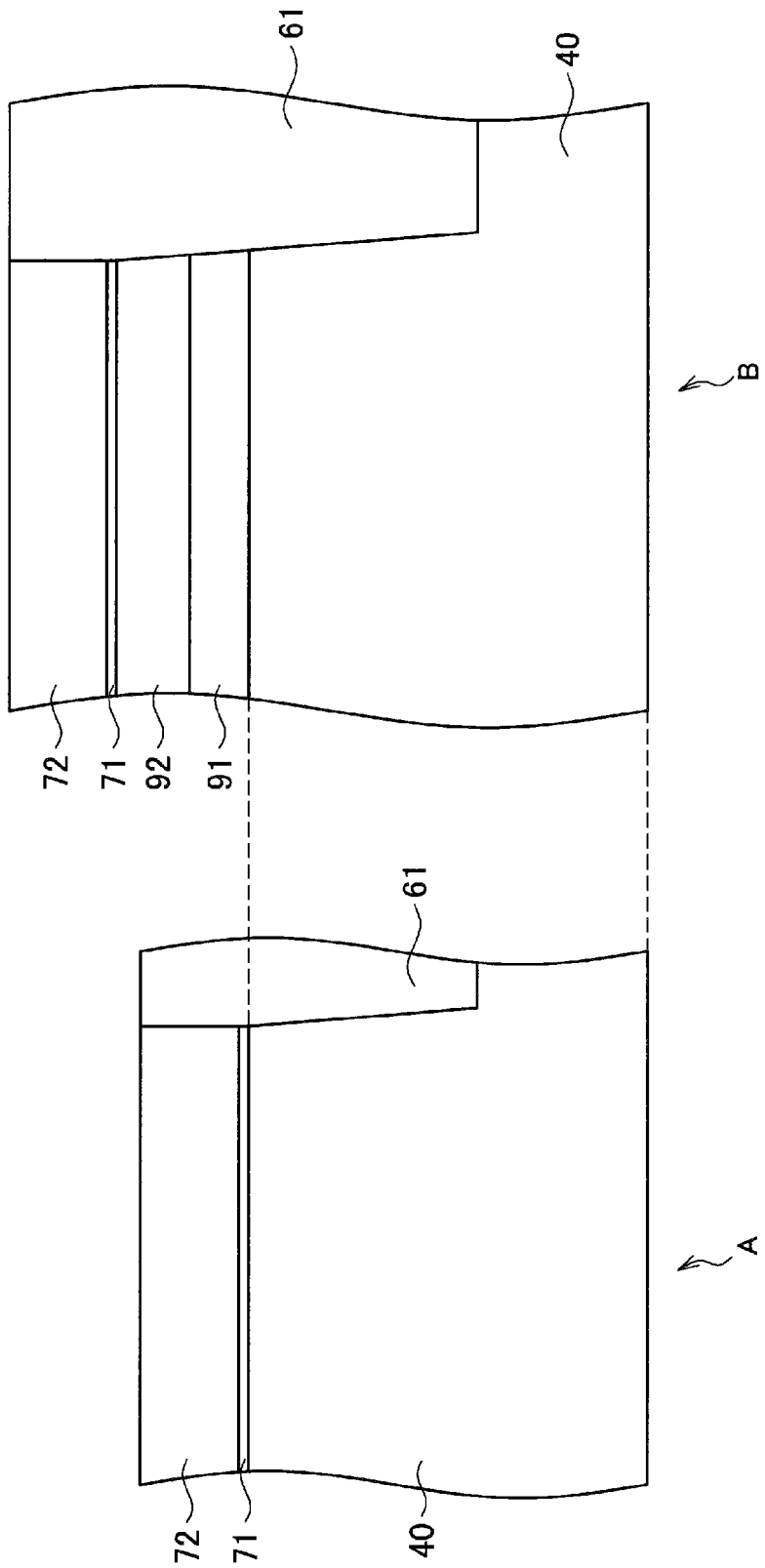
FIG. 17 is a cross-sectional view describing each manufacturing process of the semiconductor device according to this embodiment.

Next, as illustrated in FIG. 17, after the buried insulating layer 91 and the third semiconductor layer 92 in the region in which the storage device 10 is to be provided are removed, the insulating layers 71 and 72 are formed, and furthermore, the element separation layer 61 is formed.

Specifically, by performing the anisotropic etching after opening only the region in which the storage device 10 is to be provided, using a resist patterned by the lithography, the buried insulating layer 91 and the third semiconductor layer 92 in the region in which the storage device 10 is to be provided are removed.

Subsequently, after the insulating layers 71 and 72 having different compositions are formed on the semiconductor substrate 40 and the third semiconductor layer 92, the activation region 62 (region in which the semiconductor storage element 1 or the field effect transistor 2 is to be formed in a subsequent process) is protected by a patterned resist, and the insulating layers 71 and 72, the semiconductor substrate 40, and the third semiconductor layer 92 are etched in a depth of 350 nm to 400 nm.

Note that, the insulating layer 71 is a $SiO_2$ film formed by performing dry oxidation of the semiconductor substrate 40 including Si, for example, and the insulating layer 72 is a $Si_3N_4$ film formed by the low-pressure Chemical Vapor Deposition (CVD) method.

After that, by forming $SiO_2$ into a film having a film thickness of 650 nm to 700 nm, an opening formed by etching is filled, and the element separation layer 61 is formed. For example, the high-density plasma CVD method can be used for the film formation of $SiO_2$. According to this method, a $SiO_2$ film that has better unevenness coatability, and is precise can be formed as the element separation layer 61.

Subsequently, the surfaces of the semiconductor substrate 40 and the third semiconductor layer 92 are planarized by polishing the insulating layer 72 and the element separation layer 61 using the Chemical Mechanical Polish (CMP) method. Note that, the polishing by the CMP is preferably performed to such a degree that the element separation layer 61 formed on the insulating layer 72 can be removed. In addition, unevenness in the entire substrate may be reduced by selectively etching protruding regions using a resist or the like that is patterned by the lithography or the like, precedential to the polishing by the CMP.

Figure 18:
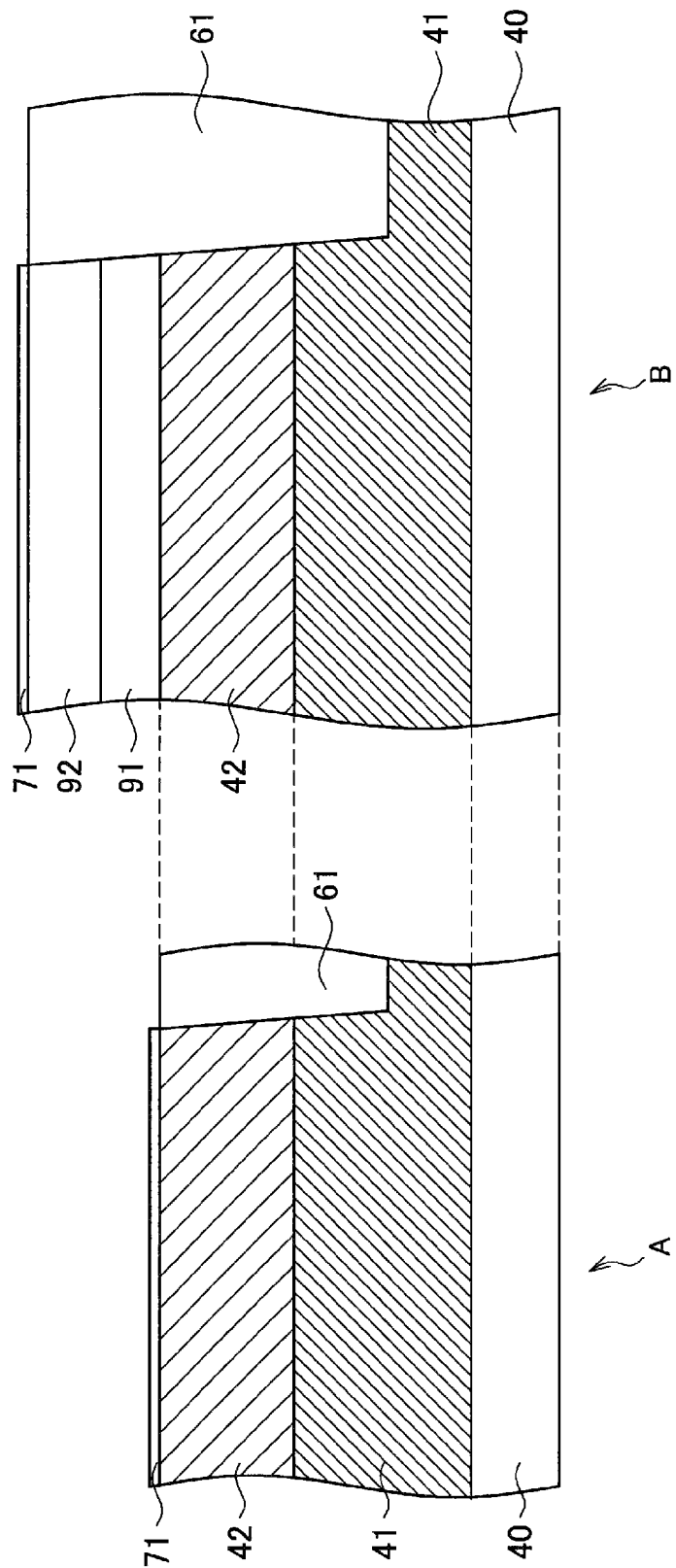
FIG. 18 is a cross-sectional view describing each manufacturing process of the semiconductor device according to this embodiment.

Next, as illustrated in FIG. 18, after the insulating layer 72 is removed, impure substance doping is performed, and the first semiconductor layer 42 and the second semiconductor layer 41 are formed, and in addition, the third semiconductor layer 92 is made into the first conductivity type.

Specifically, first of all, the insulating layer 72 is removed using hot phosphoric acid or the like. Note that, before the removal of the insulating layer 72, the semiconductor substrate 40 may be annealed under an $N_2$, $O_2$, or $H_2/O_2$ environment. This can make the element separation layer 61 into a more precise film. In addition, corners of the activation region 62 can be rounded.

Subsequently, the first semiconductor layer 42 is formed by ion-implanting an impure substance of the first conductivity type (e.g. boron, etc.) to a region corresponding to the activation region 62, after causing a growth of the insulating layer 71 being a SiO$_2$ film, by further oxidizing the semiconductor substrate 40 including Si, by about 10 nm. Subsequently, the second semiconductor layer 41 is formed by ion-implanting an impure substance of the second conductivity type (e.g. phosphorus, arsenic, etc.) to a region corresponding to the activation region 62. Furthermore, the third semiconductor layer 92 is converted into the first conductivity type by ion-implanting an impure substance of the first conductivity type (e.g. boron, etc.) to a region in which the field effect transistor 2 is to be formed in a subsequent process.

Figure 19:
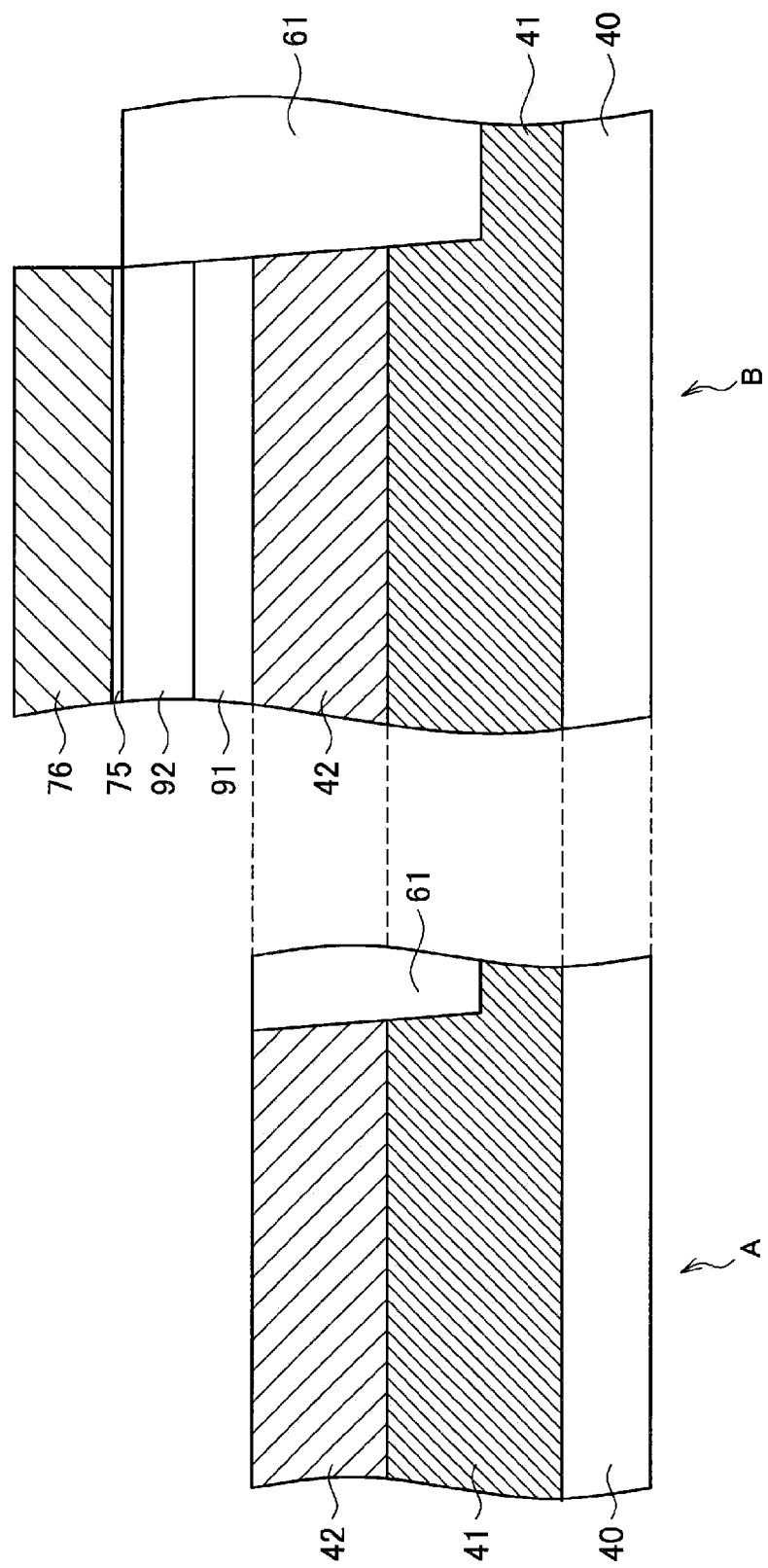
FIG. 19 is a cross-sectional view describing each manufacturing process of the semiconductor device according to this embodiment.

Next, as illustrated in FIG. 19, after an oxidized film 75 and an electrode layer 76 are formed on the first semiconductor layer 42 and the third semiconductor layer 92, the oxidized film 75 and the electrode layer 76 on the first semiconductor layer 42 are removed.

Specifically, after the insulating layer 71 is peeled off using hydrofluoric acid solution or the like, the oxidized film 75 having a film thickness of 1.5 nm to 3.0 nm is formed on the first semiconductor layer 42 and the third semiconductor layer 92 by thermal oxidation using dry O$_2$ or wet O$_2$, Rapid Thermal (RT) oxidation, or an In-Situ Stream Generation (ISSG) method. After that, polysilicon is formed into a film having a film thickness of 50 nm to 150 nm, on the oxidized film 75 by the low-pressure CVD method performed at a film formation temperature of 580° C. to 620° C. using SiH$_4$ gas, and the electrode layer 76 is formed.

Next, by opening the region in which the first semiconductor layer 42 is formed (i.e, the region in which the semiconductor storage element 1 is to be formed), using a resist patterned by the lithography, and performing the anisotropic etching, the oxidized film 75 and the electrode layer 76 on the first semiconductor layer 42 are removed. The anisotropic etching can be performed by dry etching that uses HBr or Cl-based gas, for example.

Figure 20:
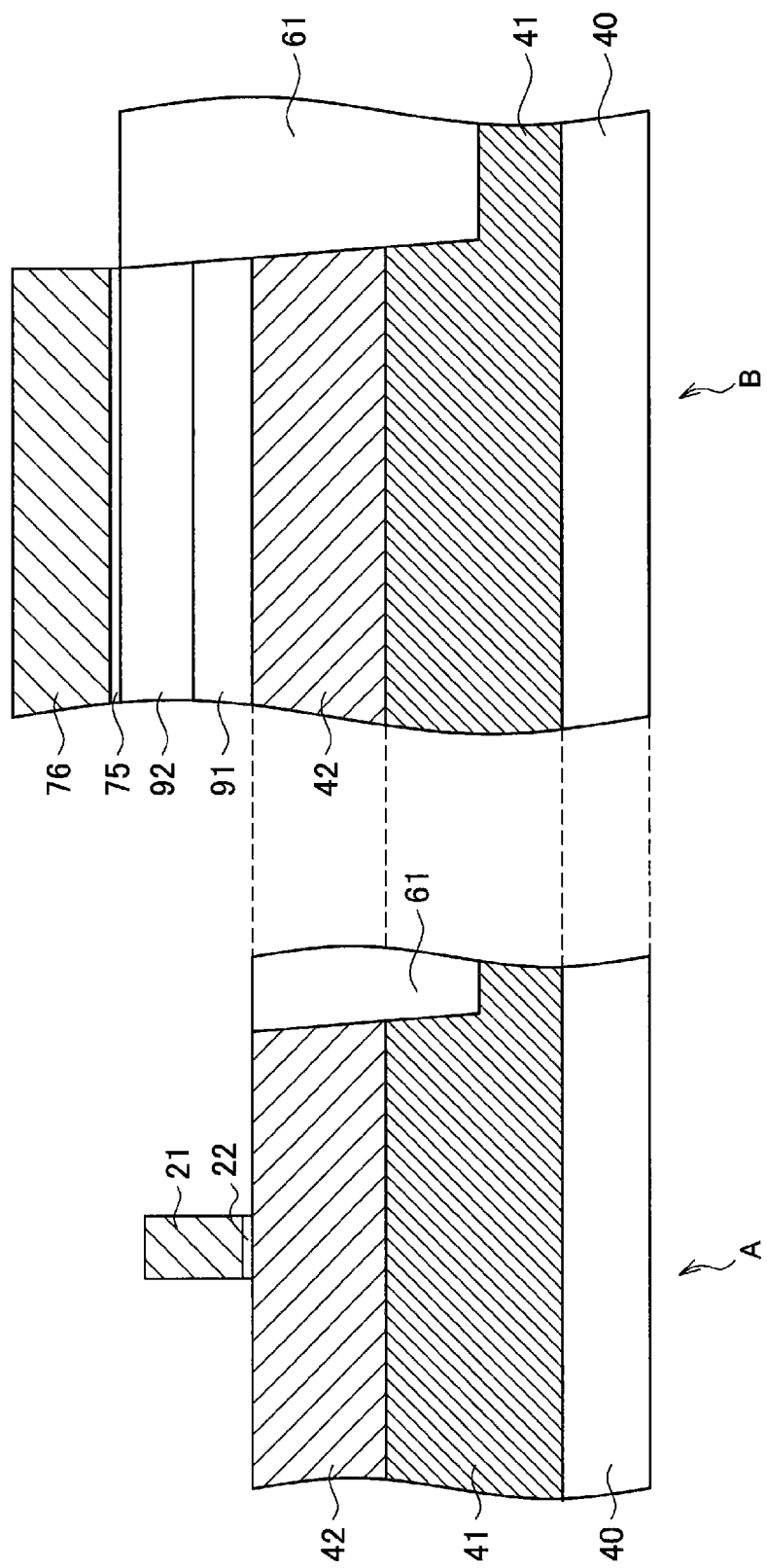
FIG. 20 is a cross-sectional view describing each manufacturing process of the semiconductor device according to this embodiment.

Subsequently, as illustrated in FIG. 20, the gate insulator film 22 is formed, and the gate electrode 21 is formed on the gate insulator film 22.

Specifically, a base including SiO$_2$ is formed into a film thickness of 0.5 nm to 1.5 nm using the Rapid Thermal Oxidization (RTO) treatment, the oxygen plasma treatment, treatment using hydrogen peroxide containing chemical solution, or the like. Subsequently, hafnium oxide (HfO$_x$) being a high-dielectric member is formed into a film by the CVD method, the Atomic Layer Deposition (ALD) method, or the like. The gate insulator film 22 is thereby formed.

Note that, zirconium oxide (ZrO$_x$), hafnium zirconium oxide (HfZrO$_x$), or the like can be used in place of the hafnium oxide. In addition, these high-dielectric members may be doped with lanthanum (La), silicon (Si), gadolinium (Gd), or the like.

Next, after TiN or TaN is formed into a film thickness of 5 nm to 20 nm using the sputtering method, the CVD method, the ALD method, or the like, polysilicon is formed into a film having a film thickness of 50 nm to 150 nm, by the low-pressure CVD method that uses SiH$_4$ gas. Furthermore, by performing the anisotropic etching using a resist patterned by the lithography, as a mask, the gate electrode 21 is formed. Note that, by the anisotropic etching performed at this time, the gate insulator film 22 and the gate electrode 21 that are formed in a region in which the electrode layer 76 is provided (i.e. region in which the field effect transistor 2 is to be formed) are also removed.

Next, as illustrated in FIG. 21, by patterning the oxidized film 75 and the electrode layer 76 by the lithography, the gate insulator film 222 and the gate electrode 221 are formed.

Specifically, the gate electrode 21 is formed by performing the anisotropic etching of the oxidized film 75 and the electrode layer 76 using a resist patterned by the lithography, as a mask. Note that, at this time, the region in which the first semiconductor layer 42 is formed (i.e. region in which the semiconductor storage element 1 is to be formed) is naturally protected by the resist.

Subsequently, by going through processes similar to the processes described using FIGS. 6 to 10, the semiconductor device 100 according to the present embodiment can be formed. According to the above processes, because the semiconductor storage element 1 to be provided in the storage device 10 of the semiconductor device 100, and the field effect transistor 2 to be provided in the logic circuit 200 or the like can be simultaneously formed, the manufacturing processes of the semiconductor device 100 can be shortened. In addition, operation speed of the field effect transistor 2 to be provided in the logic circuit 200 or the like can be increased, and power consumption can be reduced.

3. CONCLUSION

As described above, the semiconductor storage element 1 according to the first embodiment of the present disclosure can control an electric potential of the first semiconductor layer 42, at the contact plug 52 provided inside the element, and control residual polarization of the gate insulator film 22. This enables the semiconductor storage element 1 according to the first embodiment to operate at higher speed. In addition, because the semiconductor storage element 1 according to the first embodiment can control residual polarization of the gate insulator film 22, at the contact plug 52 provided for each element, interference between elements can be eliminated, and independent operations are enabled.

In addition, in the semiconductor device 100 according to the second embodiment of the present disclosure, the storage device 10 including the semiconductor storage element 1 according to the first embodiment, and the logic circuit 200 including a field effect transistor or the like can be mixedly mounted on one chip. This can further downsize the semiconductor device 100 according to the second embodiment.

Furthermore, according to the present disclosure, an electronic device including the storage device 10 including the semiconductor storage element 1 according to the first embodiment, or an electronic device including the semiconductor device 100 according to the second embodiment can also be provided. As such an electronic device, for example, a personal computer, various display devices such as a liquid crystal display device and an organic electroluminescence display device, a mobile phone, a smartphone, a game device, an Internet of Things (IoT) device, and the like can be exemplified.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor storage element including:
a first semiconductor layer of a first conductivity type;
a second semiconductor layer of a second conductivity type that is provided below the first semiconductor layer:
a gate electrode provided on the first semiconductor layer;
a gate insulator film provided between the first semiconductor layer and the gate electrode;
a drain region of the second conductivity type that is provided in the first semiconductor layer on one side of the gate electrode:
a source region of the second conductivity type that is provided in the first semiconductor layer on another side facing the one side across the gate electrode; and
a bit line configured to electrically connect with both of the source region and the first semiconductor layer.

(2)

The semiconductor storage element according to (1), further including:
an insulating element separation layer that is provided between the semiconductor storage element and another element, and is configured to electrically separate the other element.

(3)

The semiconductor storage element according to (2), in which the element separation layer is provided up to a region deeper than the first semiconductor layer, and the second semiconductor layer is provided up to a region deeper than the element separation layer.

(4)

The semiconductor storage element according to (2) or (3), in which the bit line connects with both of the source region and the first semiconductor layer via a contact plug provided at a boundary between the element separation layer and the first semiconductor layer.

(5)

The semiconductor storage element according to (4), in which the contact plug is provided up to a depth not reaching the second semiconductor layer.

(6)

The semiconductor storage element according to any one of (1) to (3), in which the bit line connects with both of the source region and the first semiconductor layer via a contact region provided from the source region over a side surface of the first semiconductor layer.

(7)

The semiconductor storage element according to any one of (1) to (6), in which at least a part of the gate insulator film is ferroelectric material.

(8)

The semiconductor storage element according to any one of (1) to (7), further including:
a liner layer that is provided on the gate electrode and the first semiconductor layer, and is configured to add compressional stress or tensile stress.

(9)

The semiconductor storage element according to (8), in which magnitude of the compressional stress or tensile stress is 1 GPa or more.

(10)

A semiconductor device including:
a storage device in which semiconductor storage elements are arranged in a matrix,
in which each of the semiconductor storage elements includes
a first semiconductor layer of a first conductivity type,
a second semiconductor layer of a second conductivity type that is provided below the first semiconductor layer,
a gate electrode provided on the first semiconductor layer,
a gate insulator film provided between the first semiconductor layer and the gate electrode,
a drain region of the second conductivity type that is provided in the first semiconductor layer on one side of the gate electrode.
a source region of the second conductivity type that is provided in the first semiconductor layer on another side facing the one side across the gate electrode, and
a bit line configured to electrically connect with both of the source region and the first semiconductor layer.

(11)

The semiconductor device according to (10), further including:
a logic circuit provided on a same substrate as the storage device.

(12)

The semiconductor device according to (11), in which the logic circuit is provided on a region in which an insulating layer and a semiconductor layer are sequentially stacked on a support substrate.

(13)

A electronic device including:
a storage device in which semiconductor storage elements are arranged in a matrix,
in which each of the semiconductor storage elements includes
a first semiconductor layer of a first conductivity type,
a second semiconductor layer of a second conductivity type that is provided below the first semiconductor layer,
a gate electrode provided on the first semiconductor layer,
a gate insulator film provided between the first semiconductor layer and the gate electrode,
a drain region of the second conductivity type that is provided in the first semiconductor layer on one side of the gate electrode,
a source region of the second conductivity type that is provided in the first semiconductor layer on another side facing the one side across the gate electrode, and
a bit line configured to electrically connect with both of the source region and the first semiconductor layer.

(14)

A manufacturing method of a semiconductor storage element, the manufacturing method including:
a process of forming a first semiconductor layer of a first conductivity type, and a second semiconductor layer of a second conductivity type that is to be provided below the first semiconductor layer;
a process of forming a gate insulator film on the first semiconductor layer;
a process of forming a gate electrode on the gate insulator film:
a process of forming a drain region of the second conductivity type, in the first semiconductor layer on one side of the gate electrode, and forming a source region of the second conductivity type, in the first semiconductor layer on another side facing the one side across the gate electrode; and a process of forming a bit line configured to electrically connect with both of the source region and the first semiconductor layer.

(15)

The manufacturing method of a semiconductor storage element according to (14), further including:

a process of forming an insulating element separation layer configured to electrically separate the semiconductor storage element from another element, before forming the first semiconductor layer and the second semiconductor layer.

(16)

The manufacturing method of a semiconductor storage element according to (15), in which both of the source region and the first semiconductor layer, and the bit line are electrically connected by forming a contact plug at a boundary between the element separation layer and the first semiconductor layer.

(17)

The manufacturing method of a semiconductor storage element according to (15), in which both of the source region and the first semiconductor layer, and the bit line are electrically connected by etching the element separation layer, exposing side surfaces of the first semiconductor layer and the source region, and forming a contact region from the source region over the side surface of the first semiconductor layer.

(18)

The manufacturing method of a semiconductor storage element according to any one of (14) to (17), further including:

a process of removing an insulating layer and a semiconductor layer that are sequentially stacked on a support substrate, before forming the first semiconductor layer and the second semiconductor layer.

REFERENCE SIGNS LIST 1 semiconductor storage element
10 storage device
21 gate electrode
22 gate insulator film
31 drain region
32 source region
21S, 31S, 32S contact region
31E, 32E extension region
40 semiconductor substrate
41 second semiconductor layer
42 first semiconductor layer
43 side wall insulating film
44 liner layer
45 planarization film
51, 52, 56 contact plug
53 data line
54 bit line
55 word line
61 element separation layer
91 buried insulating layer
92 third semiconductor layer
100 semiconductor device
200 logic circuit

What is claimed is:

1. A semiconductor storage element comprising:
a first semiconductor layer of a first conductivity type;
a second semiconductor layer of a second conductivity type that is provided directly below the first semiconductor layer in a planar view, wherein the second semiconductor layer prevents voltage applied to the first semiconductor from interfering with an adjacent semiconductor storage element;
a gate electrode provided on the first semiconductor layer;
a gate insulator film provided between the first semiconductor layer and the gate electrode, the gate insulator film comprising a ferroelectric material;
a drain region of the second conductivity type that is provided in the first semiconductor layer on one side of the gate electrode;
a source region of the second conductivity type that is provided in the first semiconductor layer on another side facing the one side of the gate electrode; and
a bit line configured to electrically connect with both of the source region and the first semiconductor layer, wherein the bit line generates an electric field and controls polarization of the gate insulator film.

2. The semiconductor storage element according to claim 1, further comprising:
an insulating element separation layer configured to electrically separate the semiconductor storage element from the adjacent semiconductor storage element.

3. The semiconductor storage element according to claim 2, wherein the element separation layer is provided up to a region deeper than the first semiconductor layer, and the second semiconductor layer is provided up to a region deeper than the element separation layer.

4. The semiconductor storage element according to claim 2, wherein the bit line connects with both of the source region and the first semiconductor layer via a contact plug provided at a boundary between the element separation layer and the first semiconductor layer.

5. The semiconductor storage element according to claim 4, wherein the contact plug is provided up to a depth not reaching the second semiconductor layer.

6. The semiconductor storage element according to claim 1, wherein the bit line connects with both of the source region and the first semiconductor layer via a contact region provided from the source region over a side surface of the first semiconductor layer.

7. The semiconductor storage element according to claim 1, wherein the ferroelectric material has a perovskite structure.

8. The semiconductor storage element according to claim 1, further comprising:
a liner layer that is provided on the gate electrode and the first semiconductor layer, and is configured to add compressional stress or tensile stress.

9. The semiconductor storage element according to claim 8, wherein magnitude of the compressional stress or tensile stress is 1 GPa or more.

10. A semiconductor device comprising:
a storage device in which semiconductor storage elements are arranged in a matrix,
wherein each of the semiconductor storage elements includes
a first semiconductor layer of a first conductivity type,
a second semiconductor layer of a second conductivity type that is provided directly below the first semiconductor layer in a planar view, wherein the second semiconductor layer prevents voltage applied to the first semiconductor from interfering with an adjacent semiconductor storage element,
a gate electrode provided on the first semiconductor layer,
a gate insulator film provided between the first semiconductor layer and the gate electrode, the gate insulator film comprising a ferroelectric material,
a drain region of the second conductivity type that is provided in the first semiconductor layer on one side of the gate electrode,
a source region of the second conductivity type that is provided in the first semiconductor layer on another side facing the one side of the gate electrode, and
a bit line configured to electrically connect with both of the source region and the first semiconductor layer, wherein the bit line generates an electric field and controls polarization of the gate insulator film.

11. The semiconductor device according to claim 10, further comprising:
a logic circuit provided on a same substrate as the storage device.

12. The semiconductor device according to claim 11, wherein the logic circuit is provided on a region in which an insulating layer and a semiconductor layer are sequentially stacked on a support substrate.

13. A electronic device comprising:
a storage device in which semiconductor storage elements are arranged in a matrix,
wherein each of the semiconductor storage elements includes:
a first semiconductor layer of a first conductivity type,
a second semiconductor layer of a second conductivity type that is provided directly below the first semiconductor layer in a planar view, wherein the second semiconductor layer prevents voltage applied to the first semiconductor from interfering with an adjacent semiconductor storage element,
a gate electrode provided on the first semiconductor layer,
a gate insulator film provided between the first semiconductor layer and the gate electrode, the gate insulator film comprising a ferroelectric material,
a drain region of the second conductivity type that is provided in the first semiconductor layer on one side of the gate electrode,
a source region of the second conductivity type that is provided in the first semiconductor layer on another side facing the one side of the gate electrode, and
a bit line configured to electrically connect with both of the source region and the first semiconductor layer, wherein the bit line generates an electric field and controls polarization of the gate insulator film.

14. A manufacturing method of a semiconductor storage element, the manufacturing method comprising:
a process of forming a first semiconductor layer of a first conductivity type,
a process of forming a second semiconductor layer of a second conductivity type directly below the first semiconductor layer in a planar view, wherein the second semiconductor layer prevents voltage applied to the first semiconductor from interfering with an adjacent semiconductor storage element;
a process of forming a gate insulator film on the first semiconductor layer, the gate insulator film comprising a ferroelectric material;
a process of forming a gate electrode on the gate insulator film;
a process of forming a drain region of the second conductivity type, in the first semiconductor layer on one side of the gate electrode, and forming a source region of the second conductivity type, in the first semiconductor layer on another side facing the one side of the gate electrode; and
a process of forming a bit line configured to electrically connect with both of the source region and the first semiconductor layer, wherein the bit line is configured to generate an electric field and controls polarization of the gate insulator film.

15. The manufacturing method of a semiconductor storage element according to claim 14, further comprising:
a process of forming an insulating element separation layer configured to electrically separate the semiconductor storage element from the adjacent semiconductor storage element, before forming the first semiconductor layer and the second semiconductor layer.

16. The manufacturing method of a semiconductor storage element according to claim 15, wherein both of the source region and the first semiconductor layer, and the bit line are electrically connected by forming a contact plug at a boundary between the element separation layer and the first semiconductor layer.

17. The manufacturing method of a semiconductor storage element according to claim 15, wherein both of the source region and the first semiconductor layer, and the bit line are electrically connected by etching the element separation layer, exposing side surfaces of the first semiconductor layer and the source region, and forming a contact region from the source region over the side surface of the first semiconductor layer.

18. The manufacturing method of a semiconductor storage element according to claim 14, further comprising:
a process of removing an insulating layer and a semiconductor layer that are sequentially stacked on a support substrate, before forming the first semiconductor layer and the second semiconductor layer.

* * * * *